US010635354B2

(12) United States Patent
Takada et al.

(10) Patent No.: US 10,635,354 B2
(45) Date of Patent: Apr. 28, 2020

(54) MEMORY SYSTEM

(71) Applicant: Toshiba Memory Corporation, Minato-ku (JP)

(72) Inventors: Marie Takada, Yokohama (JP); Masanobu Shirakawa, Chigasaki (JP); Tsukasa Tokutomi, Kamakura (JP)

(73) Assignee: Toshiba Memory Corporation, Minato-ku (JP)

( * ) Notice: Subject to any disclaimer, the term of this patent is extended or adjusted under 35 U.S.C. 154(b) by 57 days.

(21) Appl. No.: 16/118,543

(22) Filed: Aug. 31, 2018

(65) Prior Publication Data

US 2019/0294367 A1 Sep. 26, 2019

(30) Foreign Application Priority Data

Mar. 20, 2018 (JP) ................................ 2018-052646

(51) Int. Cl.
| | |
|---|---|
| *G11C 29/00* | (2006.01) |
| *G06F 3/06* | (2006.01) |
| *G11C 16/26* | (2006.01) |
| *G11C 16/10* | (2006.01) |
| *G11C 16/16* | (2006.01) |

(Continued)

(52) U.S. Cl.
CPC .......... *G06F 3/0659* (2013.01); *G06F 3/0604* (2013.01); *G06F 3/0679* (2013.01); *G06F 11/1068* (2013.01); *G11C 16/0483* (2013.01); *G11C 16/08* (2013.01); *G11C 16/10* (2013.01); *G11C 16/16* (2013.01); *G11C 16/26* (2013.01); *G11C 29/52* (2013.01); *G11C 11/5621* (2013.01); *G11C 11/5671* (2013.01); *H01L 27/1157* (2013.01); *H01L 27/11524* (2013.01);
(Continued)

(58) Field of Classification Search
CPC .... G06F 3/0659; G06F 3/0604; G06F 3/0679; G06F 11/1068; G11C 16/26; G11C 16/10; G11C 16/16; G11C 16/08; G11C 29/52; H01L 27/11524; H01L 27/1157; H01L 27/11556; H01L 27/11582
See application file for complete search history.

(56) References Cited

U.S. PATENT DOCUMENTS 8,250,437 B2   8/2012  Sakurada et al.
9,384,815 B2 *  7/2016  Chen ..................... G11C 11/401
(Continued)

FOREIGN PATENT DOCUMENTS

JP    2014-170600    9/2014

*Primary Examiner* — Samir W Rizk
(74) *Attorney, Agent, or Firm* — Oblon, McClelland, Maier & Neustadt, L.L.P.

(57) ABSTRACT

According to one embodiment, a memory system includes a semiconductor memory and a controller. The memory system is capable of executing a first operation and a second operation. In the first operation, the controller issues a first command sequence, the semiconductor memory applies a first voltage to a first word line and applies a second voltage to a second word line to read data from the first memory, and the read data is transmitted to the controller from the semiconductor memory. In the second operation, the controller issues a second command sequence, the semiconductor memory applies a third voltage to the first word line and applies a fourth voltage to the second word line, and data held in the memory cell array is left untransmitted to the controller.

20 Claims, 27 Drawing Sheets

(51) Int. Cl.
　　*G11C 16/08*　　　(2006.01)
　　*G06F 11/10*　　　(2006.01)
　　*G11C 29/52*　　　(2006.01)
　　*G11C 16/04*　　　(2006.01)
　　*G11C 11/56*　　　(2006.01)
　　*H01L 27/11524*　(2017.01)
　　*H01L 27/1157*　　(2017.01)
　　*H01L 27/11556*　(2017.01)
　　*H01L 27/11582*　(2017.01)

(52) U.S. Cl.
　　CPC ... *H01L 27/11556* (2013.01); *H01L 27/11582* (2013.01)

(56) References Cited

U.S. PATENT DOCUMENTS

| | | | |
|---|---|---|---|
| 10,446,239 | B1* | 10/2019 | Fifield .................. G11C 7/14 |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0284946 | A1 | 11/2011 | Kiyotoshi |
| 2012/0069663 | A1 | 3/2012 | Itagaki et al. |
| 2012/0307557 | A1 | 12/2012 | Itagaki |
| 2017/0206979 | A1 | 7/2017 | Cohen et al. |
| 2017/0221573 | A1 | 8/2017 | Darragh et al. |

\* cited by examiner

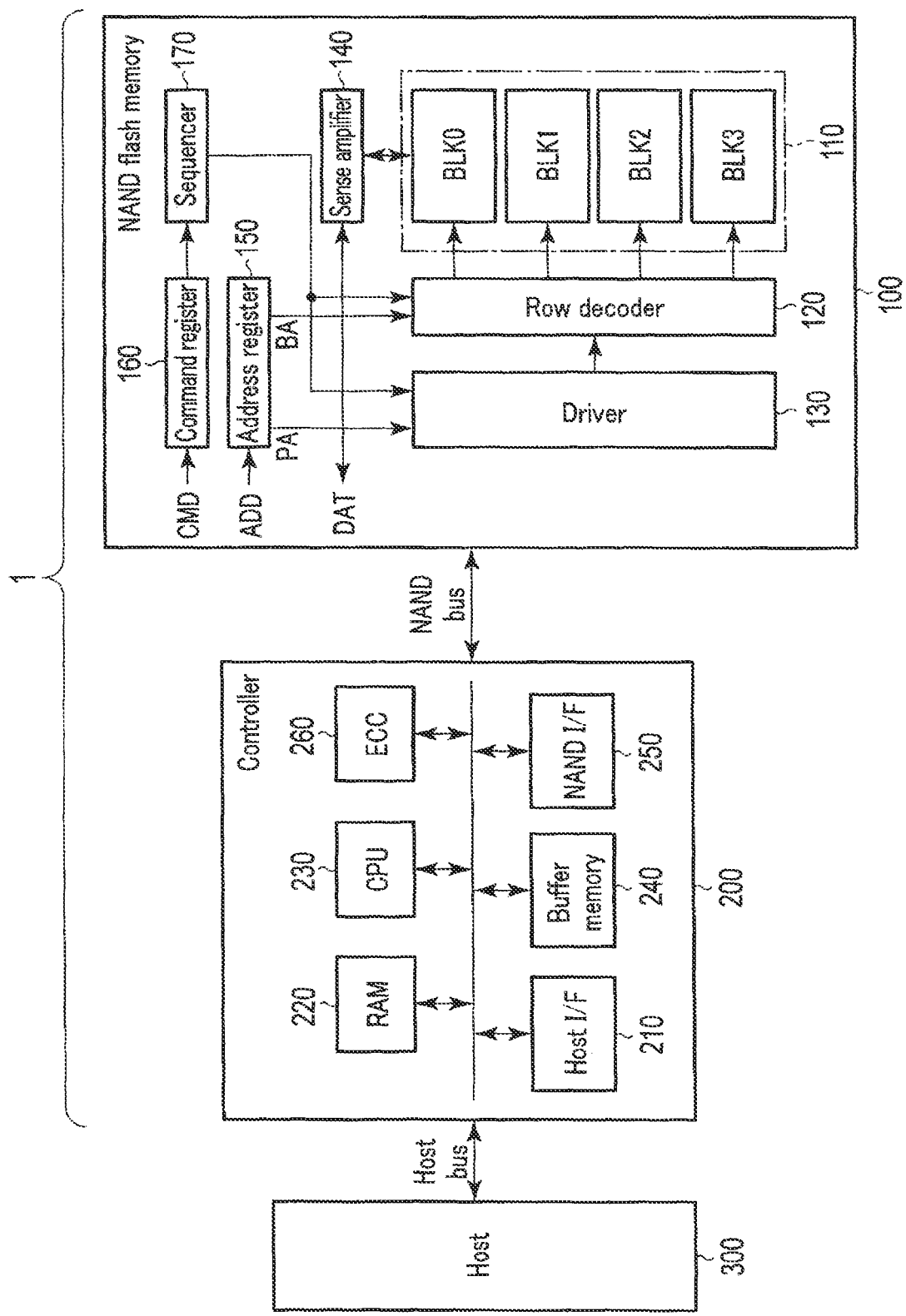
F I G. 1

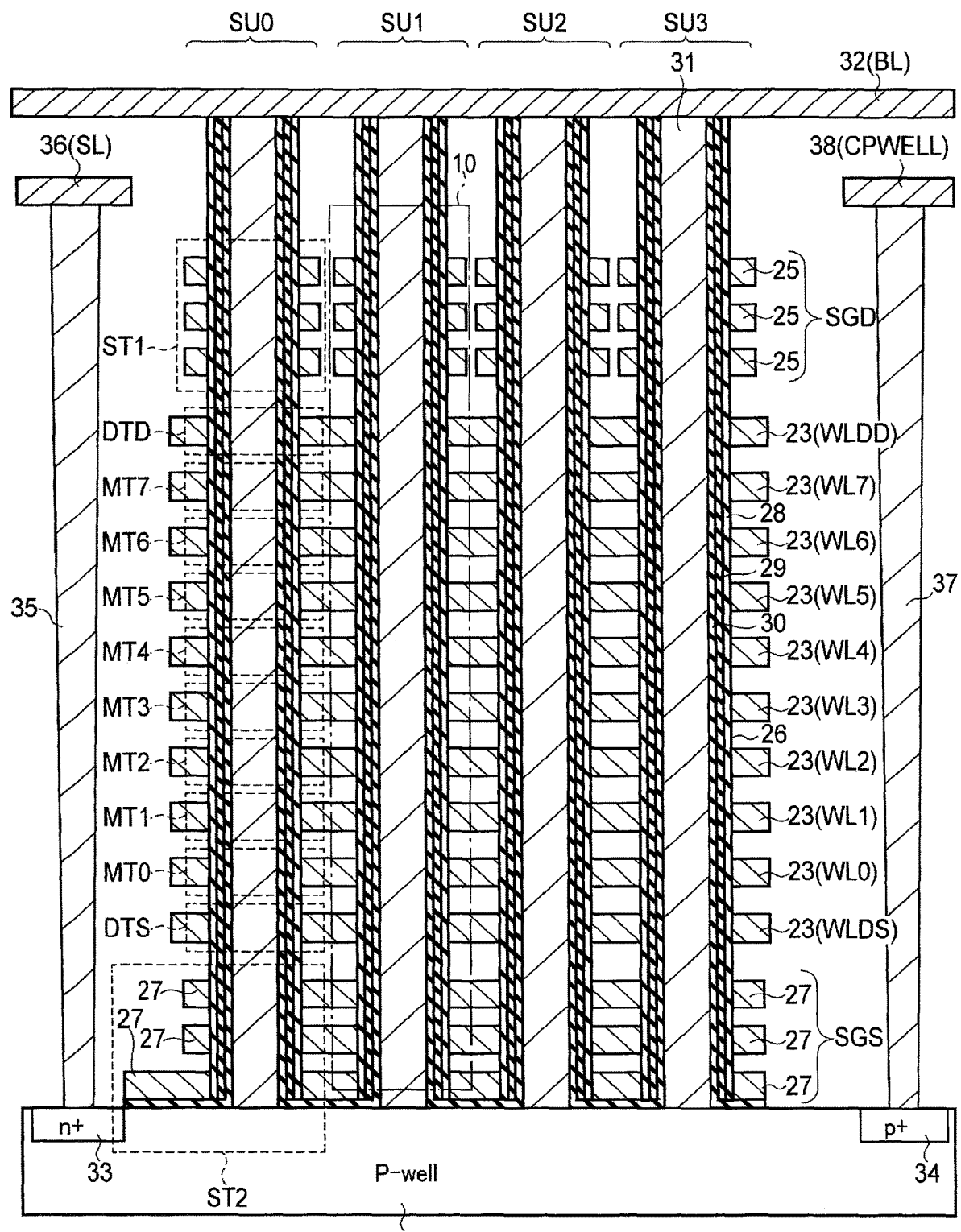
F I G. 3

| Logical block/Word line | | Index |
|---|---|---|
| LB0 | WL0 | 1 |
| | WL1 | 4 |
| | WL2 | 7 |
| | ⋮ | ⋮ |
| | WL7 | 5 |
| LB1 | WL0 | 2 |
| | WL1 | 1 |
| | WL2 | 8 |
| | ⋮ | ⋮ |
| | WL7 | 1 0 |
| LB2 | WL0 | 2 |
| | WL1 | 2 |
| | WL2 | 3 |
| | ⋮ | ⋮ |
| | WL7 | 1 1 |
| ⋮ | ⋮ | ⋮ |

F I G. 6

| Logical block | Refresh read flag | Block copy flag |
|---|---|---|
| LB0 | — | — |
| LB1 | 1 | — |
| LB2 | — | 1 |
| LB3 | — | — |
| LB4 | 1 | — |
| ⋮ | ⋮ | ⋮ |

F I G. 7

| Physical block/Word line | | Shift amount | | | | | | |
|---|---|---|---|---|---|---|---|---|
| | | AR | BR | CR | DR | ER | FR | GR |
| BLK0~BLK3 | WL0 | ΔVA1 | ΔVB1 | ΔVC1 | ΔVD1 | ΔVE1 | ΔVF1 | ΔVG1 |
| | WL1 | ΔVA4 | ΔVB4 | ΔVC4 | ΔVD4 | ΔVE4 | ΔVF4 | ΔVG4 |
| | WL2 | ΔVA7 | ΔVB7 | ΔVC7 | ΔVD7 | ΔVE7 | ΔVF7 | ΔVG7 |
| | ⋮ | ⋮ | ⋮ | ⋮ | ⋮ | ⋮ | ⋮ | ⋮ |
| | WL7 | ΔVA5 | ΔVB5 | ΔVC5 | ΔVD5 | ΔVE5 | ΔVF5 | ΔVG5 |

| Physical block/Word line | | Shift amount | | | |
|---|---|---|---|---|---|
| | | AR | BR | ...... | GR |
| BLK0~BLK3 | WL0 | ΔVA1 | ΔVB1 | ...... | ΔVG1 |
| | WL1 | ΔVA4 | ΔVB4 | ...... | ΔVG4 |
| | WL2 | ΔVA7→ΔVA8 | ΔVB7→ΔVB8 | ...... | ΔVG7→ΔVG8 |
| | ⋮ | ⋮ | ⋮ | ⋮ | ⋮ |
| | WL7 | ΔVA5 | ΔVB5 | ...... | ΔVG5 |

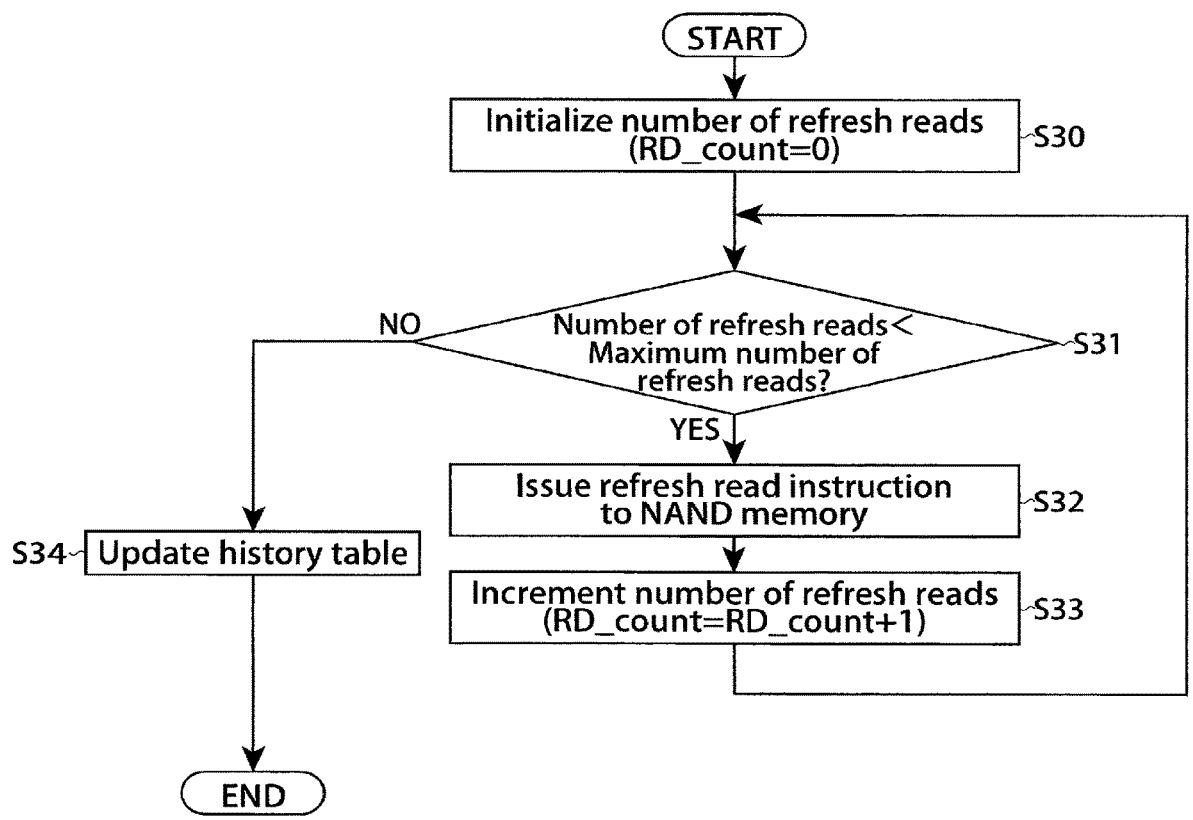
F I G. 12

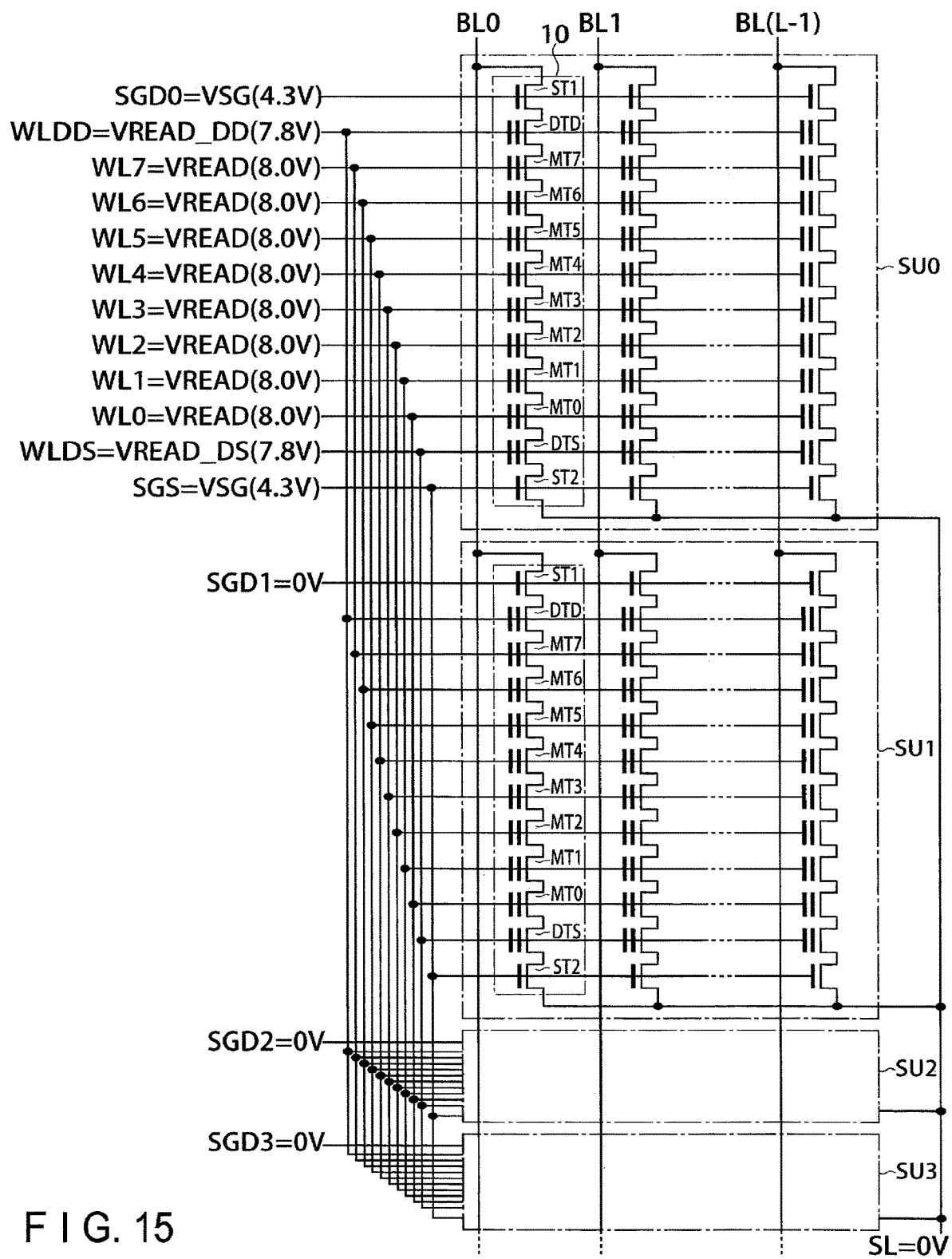
F I G. 15

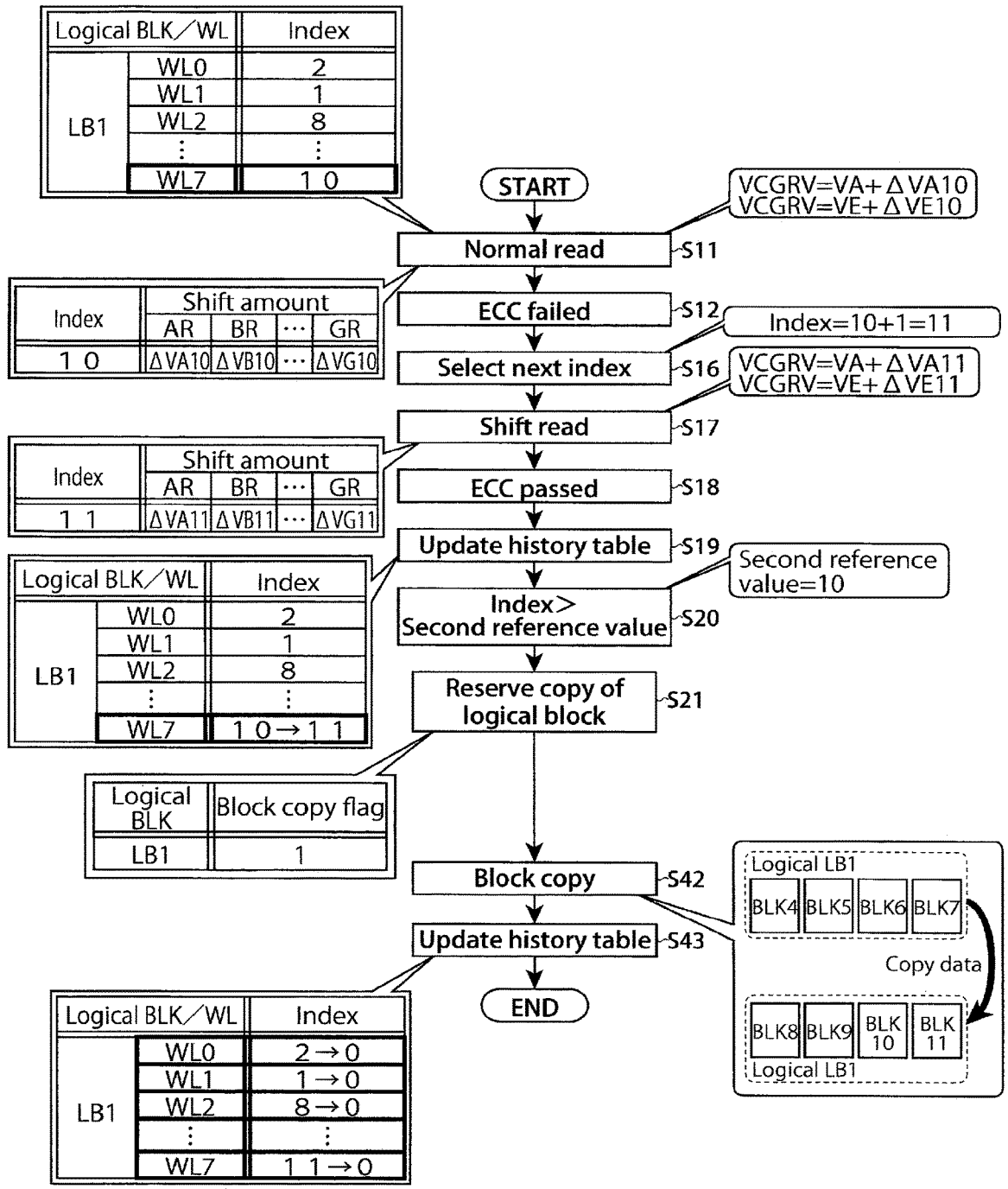
F I G. 17

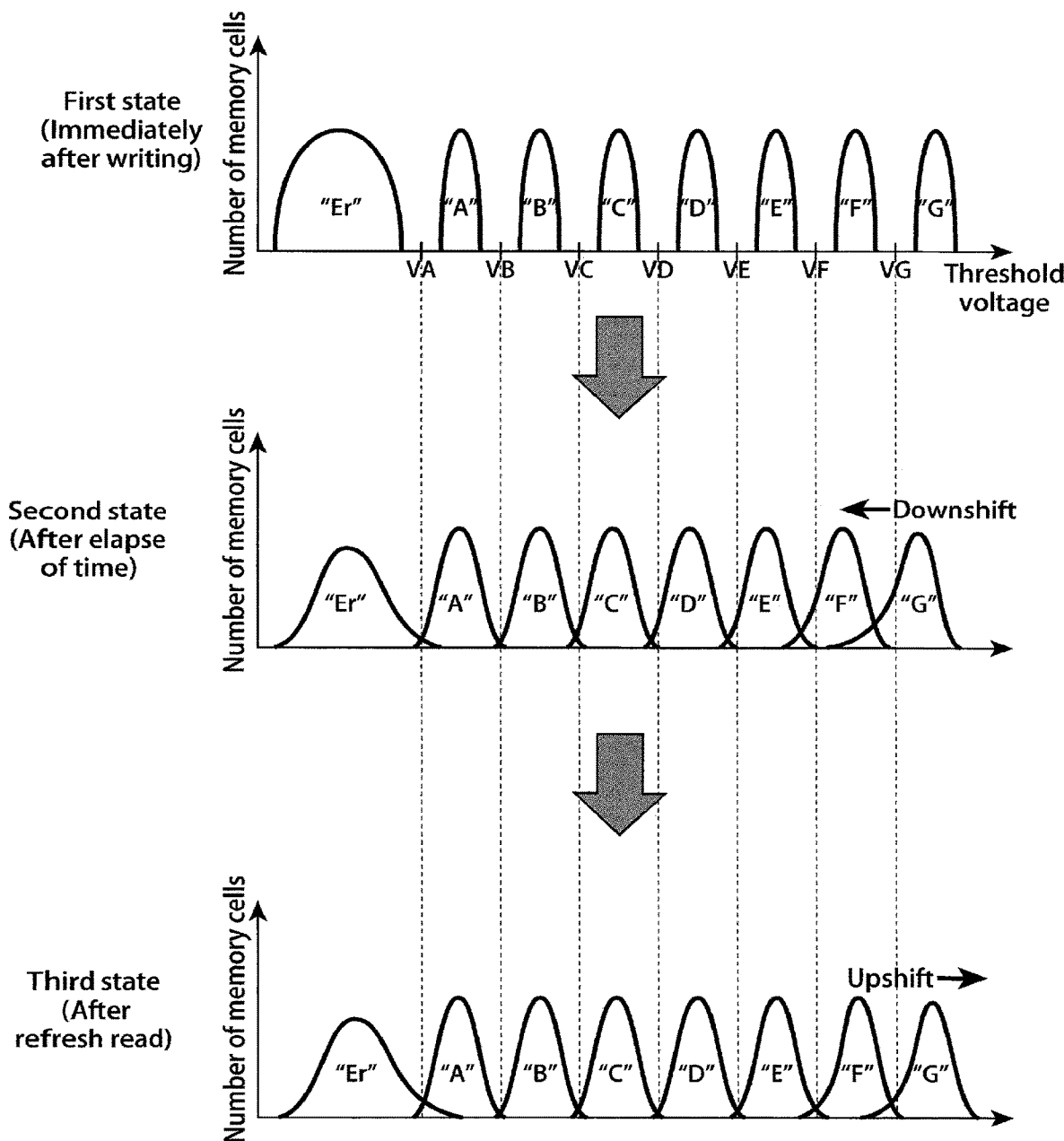
F I G. 18

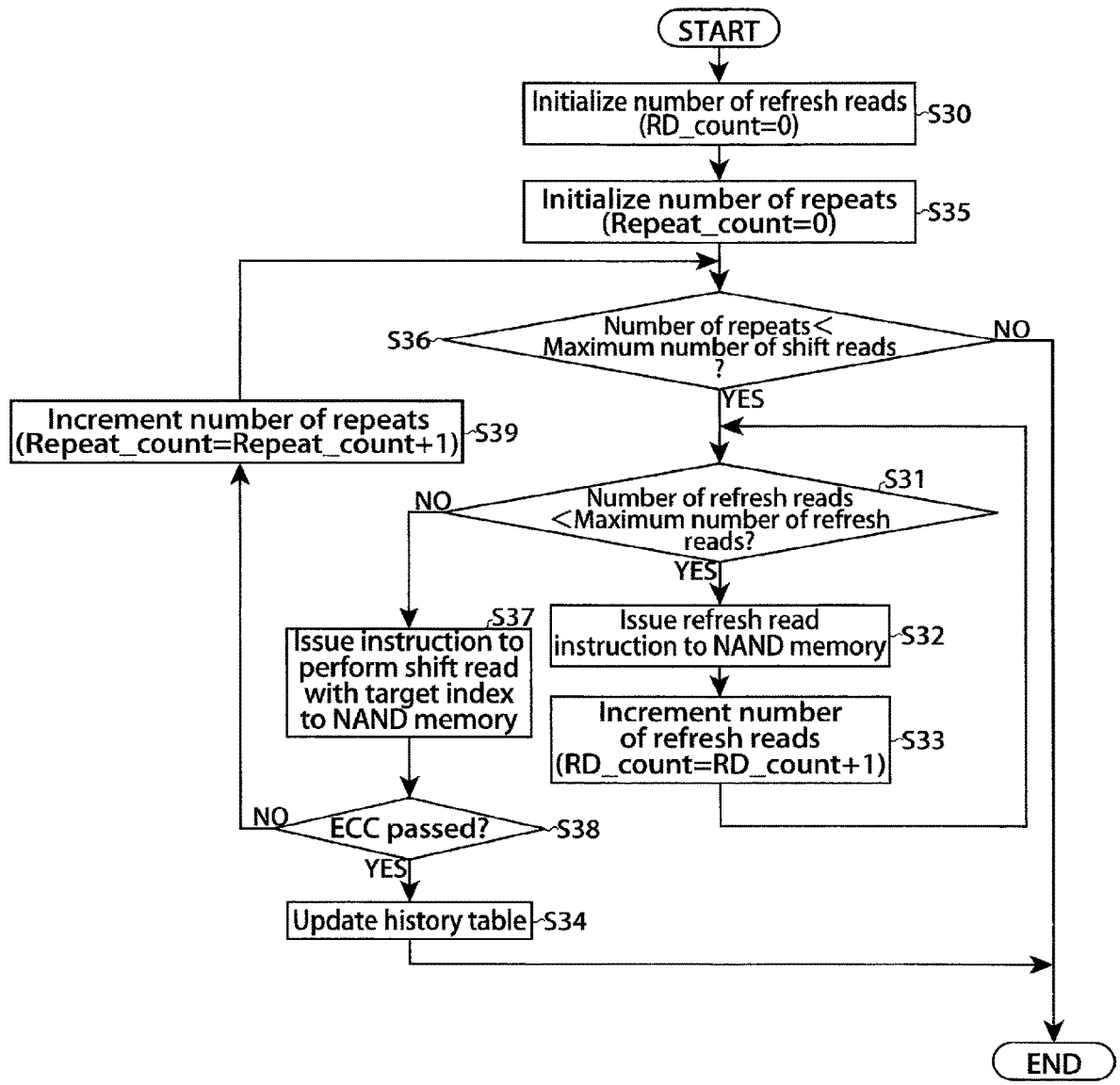
F I G. 19

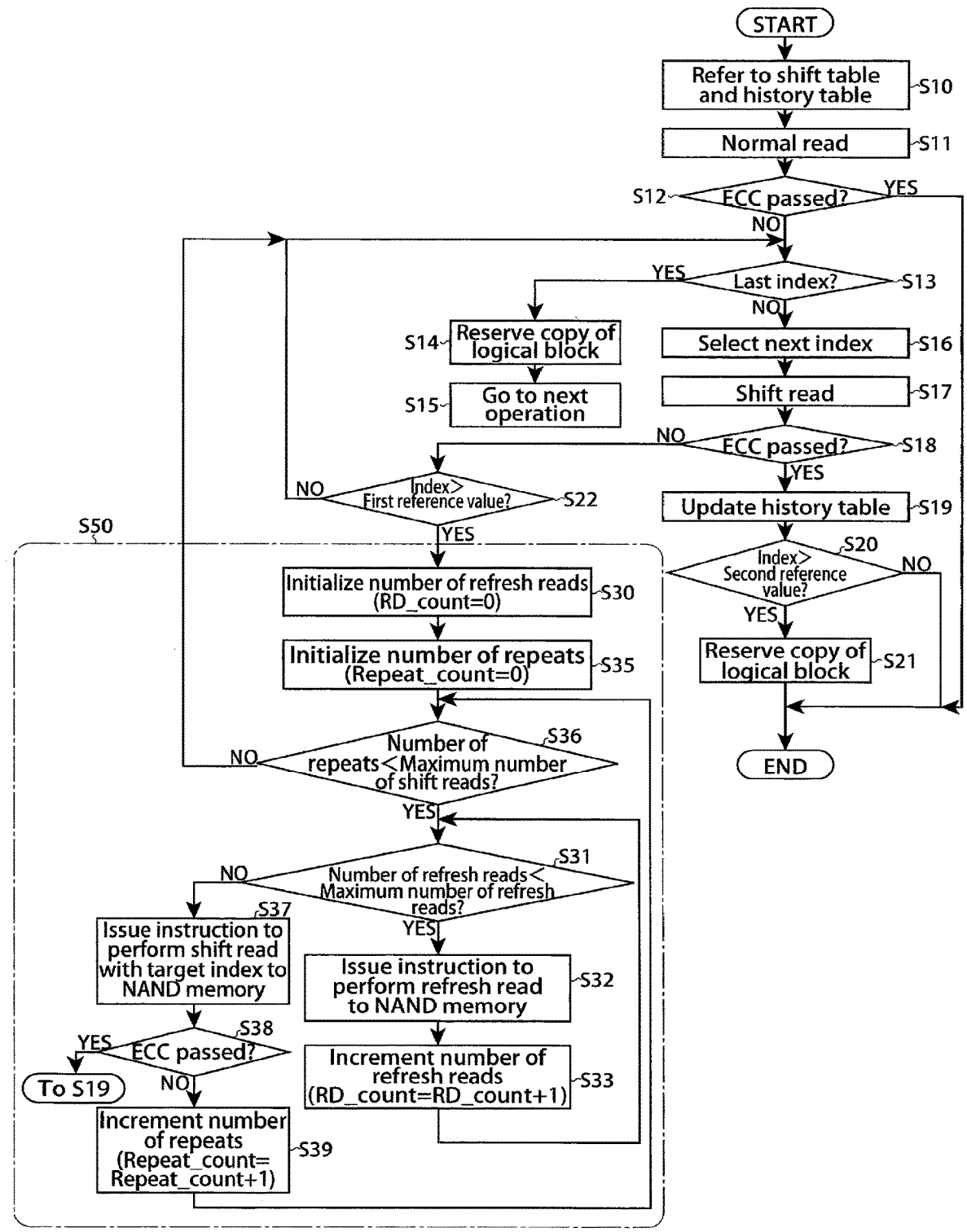
F I G. 21

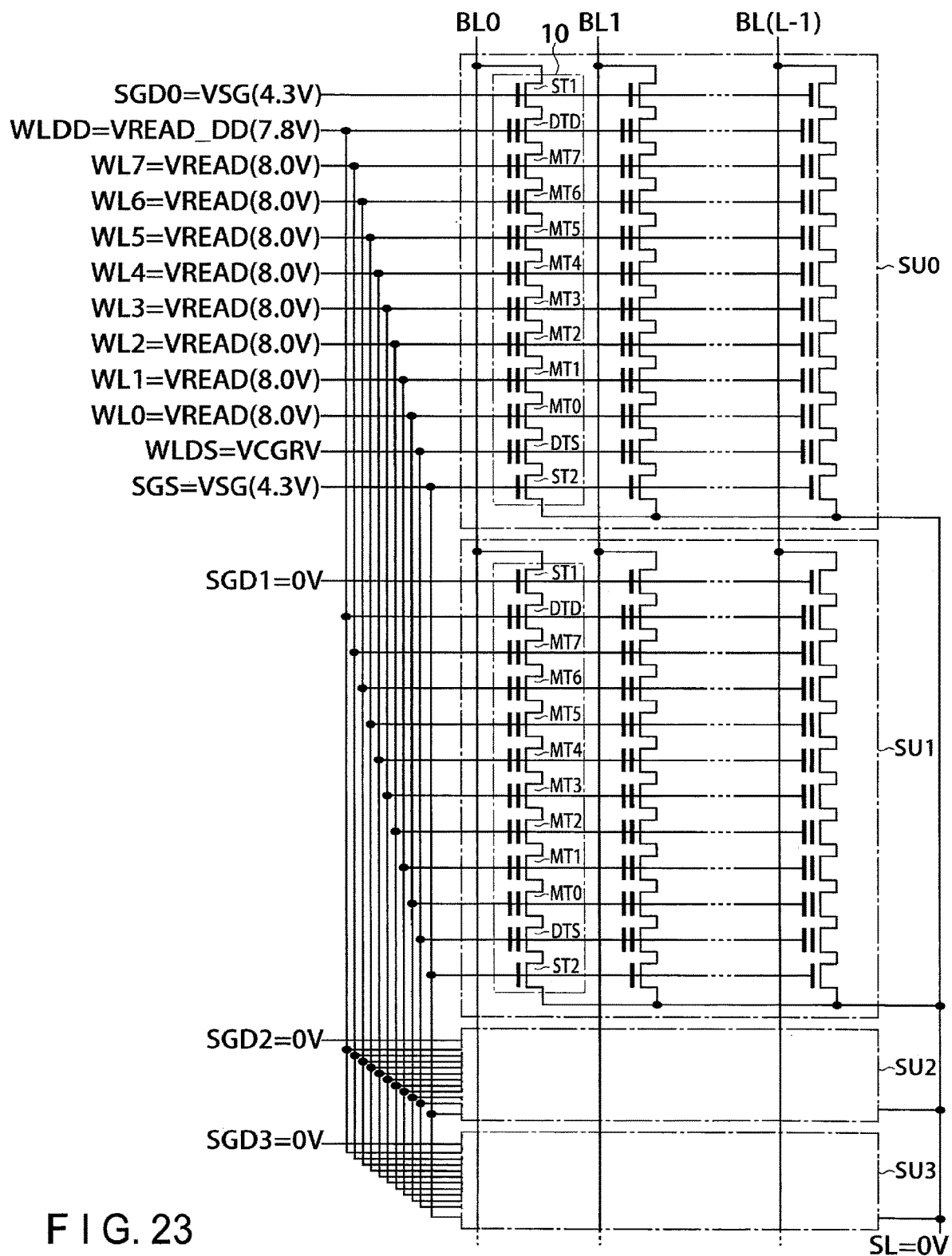
F I G. 23

| Logical block/Word line | | Index |
|---|---|---|
| LB0 | WL0,WL1 | 4 |
| | WL2,WL3 | 7 |
| | WL4,WL5 | 3 |
| | WL6,WL7 | 5 |
| ⋮ | ⋮ | ⋮ |

FIG. 25

| Logical block/Word line | | Index |
|---|---|---|
| LB0 | WL0,WL1 | 4 |
| | WL2~WL5 | 7 |
| | WL6,WL7 | 5 |
| ⋮ | ⋮ | ⋮ |

FIG. 26

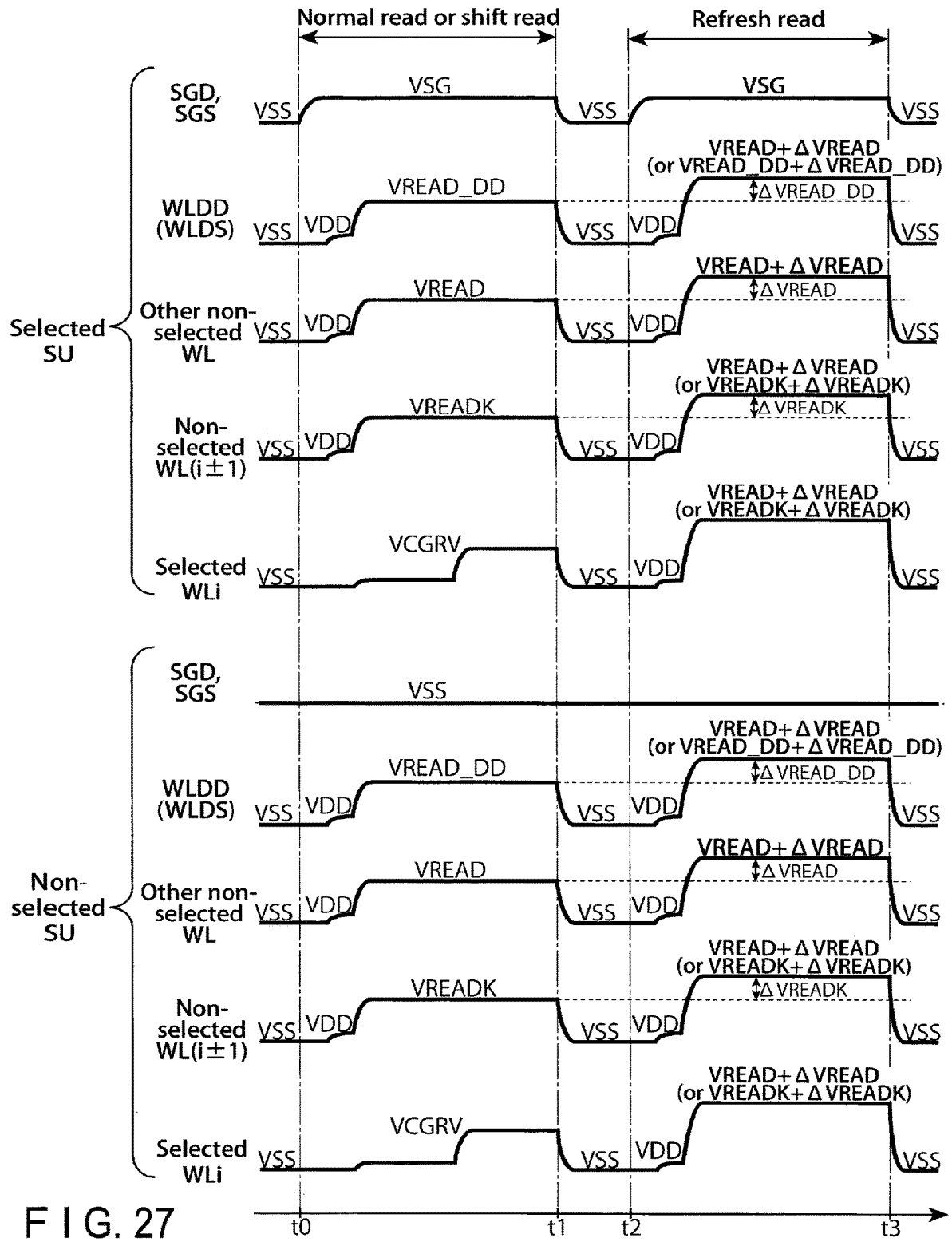
F I G. 27

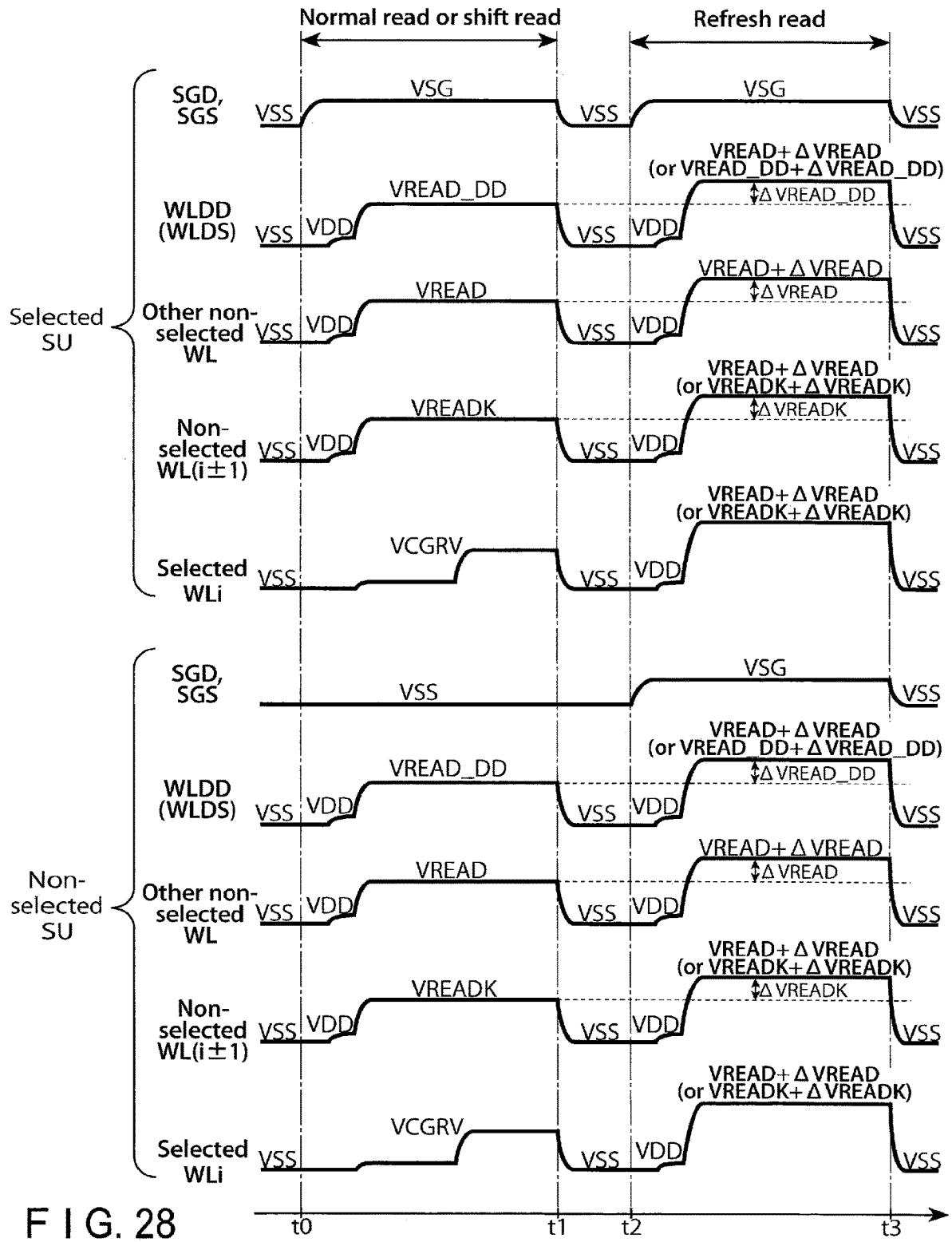
F I G. 28

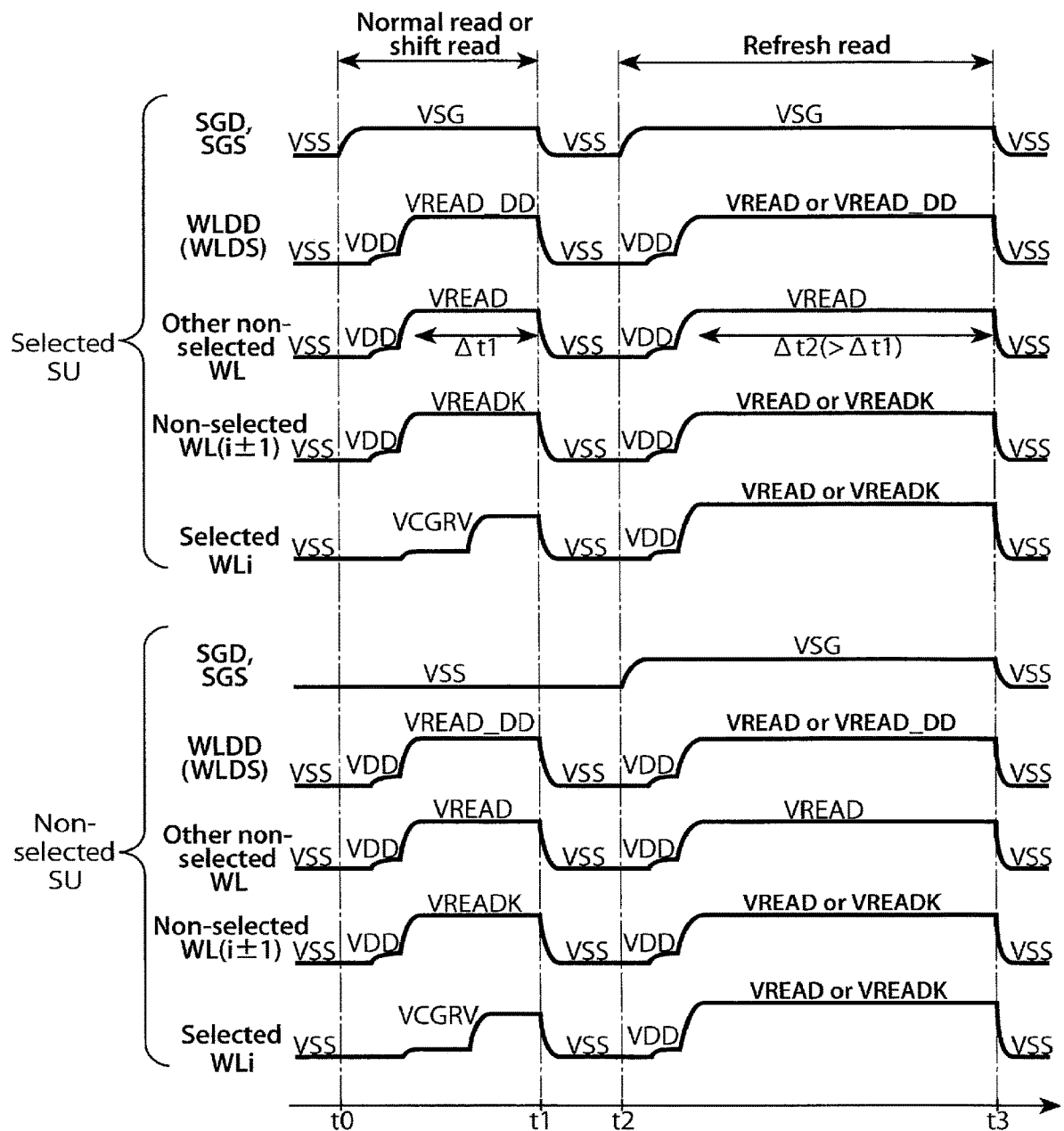
F I G. 30

MEMORY SYSTEM

CROSS-REFERENCE TO RELATED APPLICATIONS

This application is based upon and claims the benefit of priority from Japanese Patent Application No. 2018-052646, filed Mar. 20, 2018, the entire contents of which are incorporated herein by reference.

FIELD

Embodiments described herein relate generally to a memory system.

BACKGROUND

A semiconductor memory in which memory cells are three-dimensionally arranged is known.

BRIEF DESCRIPTION OF THE DRAWINGS

FIG. 1 is a block diagram of a memory system according to the first embodiment;

FIGS. 2 and 3 respectively are a circuit diagram and a sectional view of a block according to the first embodiment;

FIGS. 5 and 6 respectively are conceptual diagrams of a shift table and a history table according to the first embodiment;

FIG. 7 is a conceptual diagram of a refresh read flag and a block copy flag according to the first embodiment;

FIG. 12 is a flowchart of the refresh read operation according to the first embodiment;

FIGS. 14 and 15 respectively are circuit diagrams of a block in a normal read and a refresh read according to the first embodiment;

FIG. 17 is a flowchart of a read operation and a block copy operation according to the first embodiment;

FIG. 18 shows threshold distributions of memory cells according to the first embodiment;

FIG. 19 is a flowchart of the refresh read operation according to the second embodiment;

FIG. 21 is a flowchart of the read operation and the refresh read operation according to the third embodiment;

FIGS. 22, 23, and 24 are circuit diagrams of a block in the refresh read according to the first modification of the first to third embodiments;

FIGS. 25 and 26 are conceptual diagrams of the history table according to the second modification of the first to third embodiments; and FIGS. 27, 28, 29, and 30 are timing charts of various signals in the read operation and the refresh read operation according to the third modification of the first to third embodiments.

DETAILED DESCRIPTION

Figure 2:
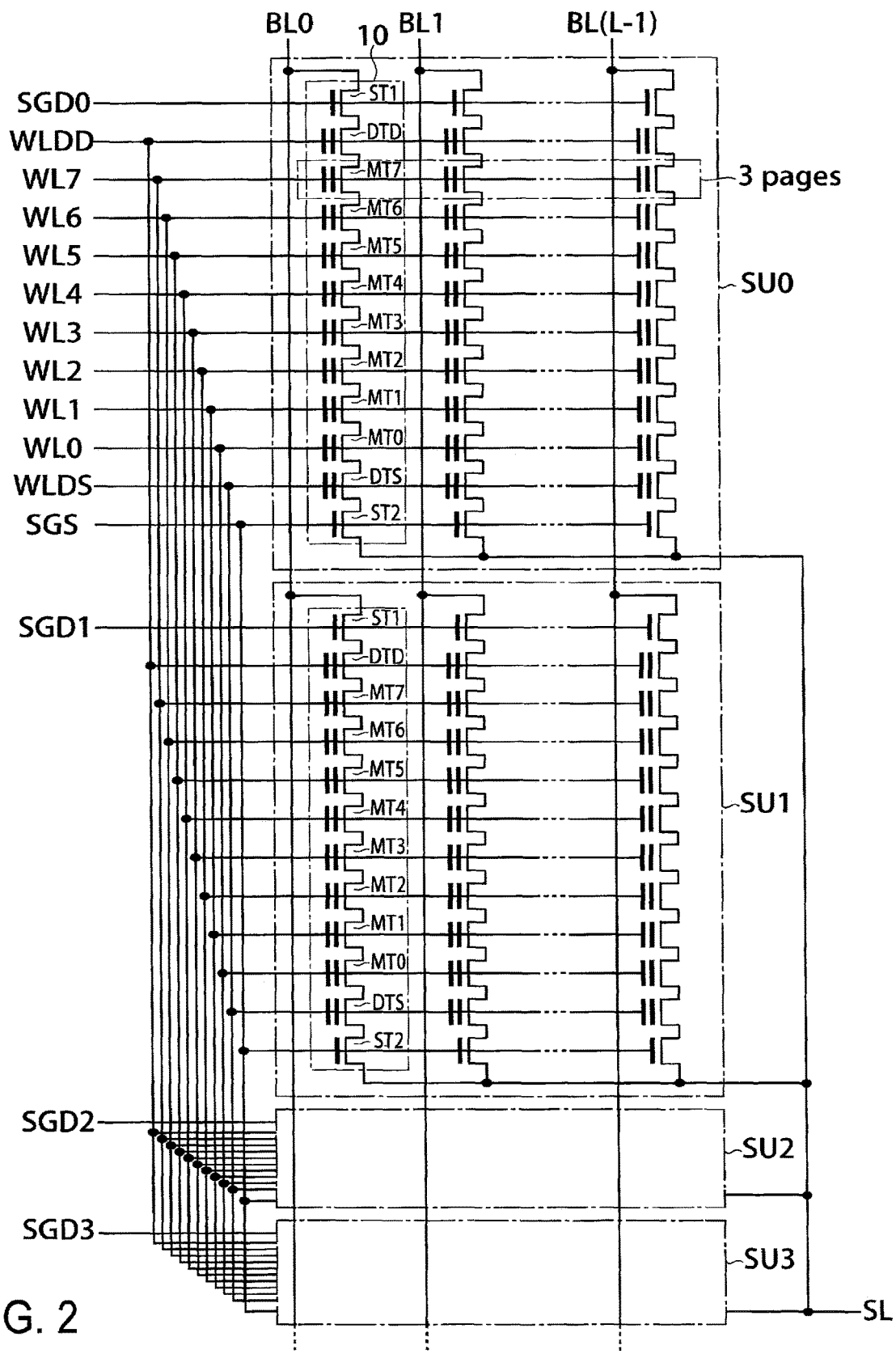

In general, according to one embodiment, a memory system includes a semiconductor memory and a controller. The memory system is capable of executing a first operation and a second operation after the first operation. The semiconductor memory includes a memory cell array including a first memory cell and a second memory cell configured to hold data and coupled respectively to a first word line and a second word line. The controller is configured to control the semiconductor memory. In the first operation, the controller issues a first command sequence and, in response to the first command sequence, the semiconductor memory applies a first voltage to the first word line and applies a second voltage to the second word line to read data from the first memory cell, and the read data is transmitted from the semiconductor memory to the controller. In the second operation, the controller issues a second command sequence and, in response to the second command sequence, the semiconductor memory applies a third voltage to the first word line and applies a fourth voltage to the second word line, and data held in the memory cell array is left untransmitted to the controller. The second operation is executed after the first operation without intervention of a write operation and erase operation on the first memory cell. The third voltage turns on the first memory cell regardless of data held in the first memory cell. The second voltage and the fourth voltage turn on the second memory cell regardless of data held in the second memory cell.

1. First Embodiment

A memory system according to the first embodiment will be described. The following description will be provided while using, as an example, a memory system including a NAND flash memory as a semiconductor memory device.

1.1 Configuration 1.1.1 Overall Configuration of Memory System

A rough overall configuration of a memory system according to the present embodiment will be described with reference to FIG. 1.

As shown in FIG. 1, a memory system 1 includes a NAND flash memory 100 and a controller 200. The NAND flash memory 100 and the controller 200 may form one semiconductor device in combination, for example. The semiconductor device is, for example, a memory card such as an SD™ card, or a solid state drive (SSD).

The NAND flash memory 100 includes a plurality of memory cells to non-volatilely store data. The controller 200 is coupled to the NAND flash memory 100 by a NAND bus, and is coupled to a host apparatus 300 by a host bus. The controller 200 controls the NAND flash memory 100, and accesses the NAND flash memory 100 in response to an instruction received from the host apparatus 300. The host apparatus 300 is, for example, a digital camera or a personal computer, and the host bus is, for example, a bus compliant with an SD™ interface. The NAND bus performs signal transmission/reception compliant with a NAND interface.

1.1.2 Configuration of Controller 200

Details of the configuration of the controller 200 will be described with continuous reference to FIG. 1. As shown in FIG. 1, the controller 200 includes a host interface circuit 210, an embedded memory (RAM) 220, a processor (CPU) 230, a buffer memory 240, a NAND interface circuit 250, and an error checking and correcting (ECC) circuit 260.

The host interface circuit 210 is coupled to the host apparatus 300 via the host bus to transfer instructions and data received from the host apparatus 300 respectively to the processor 230 and the buffer memory 240. The host interface circuit 210 also transfers data in the buffer memory 240 to the host apparatus 300 in response to an instruction from the processor 230.

The processor 230 controls the operation of the entire controller 200. For example, upon receipt of a read instruction from the host apparatus 300, the processor 230 issues, in response thereto, a read command to the NAND interface circuit 250. A similar process is performed when writing and erasing. The processor 230 also executes various processes, such as wear leveling, for managing the NAND flash memory 100.

The NAND interface circuit 250 is coupled to the NAND flash memory 100 via the NAND bus to communicate with the NAND flash memory 100. Based on instructions received from the processor 230, the NAND interface circuit 250 transmits various signals to, and receives various signals from, the NAND flash memory 100.

The buffer memory 240 temporarily holds write data and read data.

The embedded memory 220 is, for example, a semiconductor memory, such as a DRAM or an SRAM, and is used as a work area of the processor 230. The embedded memory 220 holds firmware for managing the NAND flash memory 100, and various management tables and the like, such as a shift table, a history table, and a flag table to be described later.

The ECC circuit 260 performs error detection and error correction processes on data stored in the NAND flash memory 100. Namely, the ECC circuit 260 generates an error correction code and provides write data with the error correction code in data writing, and decodes the error correction code in data reading.

1.1.3 Configuration of NAND Flash Memory 100

Next, a configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes a plurality of blocks BLK each including a plurality of nonvolatile memory cells associated with rows and columns. FIG. 1 shows four blocks BLK0 to BLK3, as an example. The memory cell array 110 stores data provided from the controller 200.

The row decoder 120 selects one of the blocks BLK0 to BLK3 based on a block address BA in the address register 150, and further selects a row in the selected block BLK.

The driver circuit 130 supplies a voltage to the selected block. BLK via the row decoder 120 based on a page address PA in the address register 150.

In data reading, the sense amplifier 140 senses data read from the memory cell array 110, and performs a necessary arithmetic operation. Then, the sense amplifier 140 outputs the data DAT to the controller 200. In data writing, the sense amplifier 140 transfers write data DAT received from the controller 200 to the memory cell array 110.

The address register 150 holds an address ADD received from the controller 200. The address ADD includes the above-mentioned block address BA and page address PA. The command register 160 holds a command CMD received from the controller 200.

The sequencer 170 controls the operation of the entire NAND flash memory 100 based on the command CMD held in the command register 160.

Next, a configuration of the block BLK will be described with reference to FIG. 2. As shown in FIG. 2, the block BLK includes, for example, four string units SU (SU0 to SU3). Each string unit SU includes a plurality of NAND strings 10.

Each NAND string 10 includes, for example, eight memory cell transistors MT (MT0 to MT7), two dummy transistors DT (DTD and DTS), and two selection transistors ST1 and ST2. Each memory cell transistor MT includes a control gate and a charge accumulation layer, and non-volatilely holds data. The memory cell transistors MT are coupled in series between the source of selection transistor ST1 and the drain of selection transistor ST2 via dummy transistors DTD and DTS, respectively.

Like the memory cell transistor MT, each dummy transistor DT includes a control gate and a charge accumulation layer. However, unlike the memory cell transistor MT, the dummy transistor DT is not used for holding data, but functions as a mere current path in the NAND string 10. Namely, the threshold of the dummy transistor DT is set at a low value so that the dummy transistor DT is always turned on in read operations and write operations. The threshold of the dummy transistor DT may be set at a predetermined value by performing a write operation on the dummy transistor DT to control the amount of charge in the charge accumulation layer.

The gates of selection transistors ST1 in string units SU0 to SU3 are coupled to respective selection gate lines SGD0 to SGD3. On the other hand, the gates of selection transistors ST2 in string units SU0 to SU3 are coupled in common to, for example, selection gate line SGS. The gates of selection transistors ST2 in string units SU0 to SU3 may of course be coupled to respective different selection gate lines SGS0 to SGS3. The control gates of the memory cell transistors MT0 to MT7 in the same block BLK are coupled in common to respective word lines WL0 to WL7, and the control gates of the dummy transistors DTD and DTS in the same block BLK are coupled in common to respective dummy word lines WLDD and WLDS.

The drains of selection transistors ST1 of the NAND strings 10 in the same column in the memory cell array 110 are coupled in common to a bit line BL (BL0 to BL(L−1), where (L−1) is a natural number equal to or larger than 2). Namely, the NAND strings 10 in the same column of a plurality of blocks BLK are coupled in common to a bit line BL. Moreover, the sources of a plurality of selection transistors ST2 are coupled in common to a source line SL.

Namely, the string unit SU includes a plurality of NAND strings 10 coupled to different bit lines BL and coupled to the same selection gate line SGD. The block BLK includes a plurality of string units SU sharing word lines WL. The memory cell array 110 includes a plurality of blocks BLK sharing bit lines BL.

FIG. 3 is a sectional view of a partial region of the block BLK. As shown in FIG. 3, a plurality of NAND strings 10 are formed on a p-type well region 20. Namely, three interconnect layers 27 functioning, for example, as selection gate line SGS, ten interconnect layers 23 functioning as dummy word line WLDS, word lines WL0 to WL7, and dummy word line WLDD, and three interconnect layers 25 functioning, for example, as selection gate line SGD, are sequentially stacked above the well region 20. Insulating films (not shown) are formed between the stacked interconnect layers.

A pillar-shaped conductor 31 extending through interconnect layers 25, 23, and 27 to reach the well region 20 is formed. A gate insulating film 30, a charge accumulation layer (insulating film) 29, and a block insulating film 28 are sequentially formed on the side surface of the conductor 31, thereby forming memory cell transistors MT, dummy transistors DT, and selection transistors ST1 and ST2. The conductor 31 functions as a current path of the NAND string 10, and is used as a region in which a channel of each transistor is formed. The upper end of the conductor 31 is coupled to a metal interconnect layer 32 that functions as a bit line BL.

In a surface region of the well region 20, an $n^+$-type impurity diffusion layer 33 is formed. A contact plug 35 is formed on the diffusion layer 33, and is coupled to a metal interconnect layer 36 that functions as a source line SL. In the surface region of the well region 20, a $p^+$-type impurity diffusion layer 34 is also formed. A contact plug 37 is formed on the diffusion layer 34, and is coupled to a metal interconnect layer 38 that functions as a well interconnect CPWELL. The well interconnect CPWELL is used to provide a potential to the conductor 31 via the well region 20.

A plurality of configurations as described above are arranged in the depth direction of the sheet of FIG. 3, and a set of a plurality of NAND strings 10 aligned in the depth direction form a string unit SU.

In the present embodiment, one memory cell transistor MT can hold, for example, 3-bit data. The bits of the 3-bit data will be referred to as a lower bit, a middle bit, and an upper bit in ascending order from the least significant bit. A set of lower bits held in memory cells coupled to the same word line will be referred to as a lower page, a set of middle bits will be referred to as a middle page, and a set of upper bits will be referred to as an upper page. Namely, three pages are assigned to one word line WL, and the block BLK including eight word lines WL has a capacity of 24 pages. In other words, "page" may also be defined as a part of a memory space formed by memory cells coupled to the same word line. Data writing and data reading may be performed in units of pages.

Figure 4:
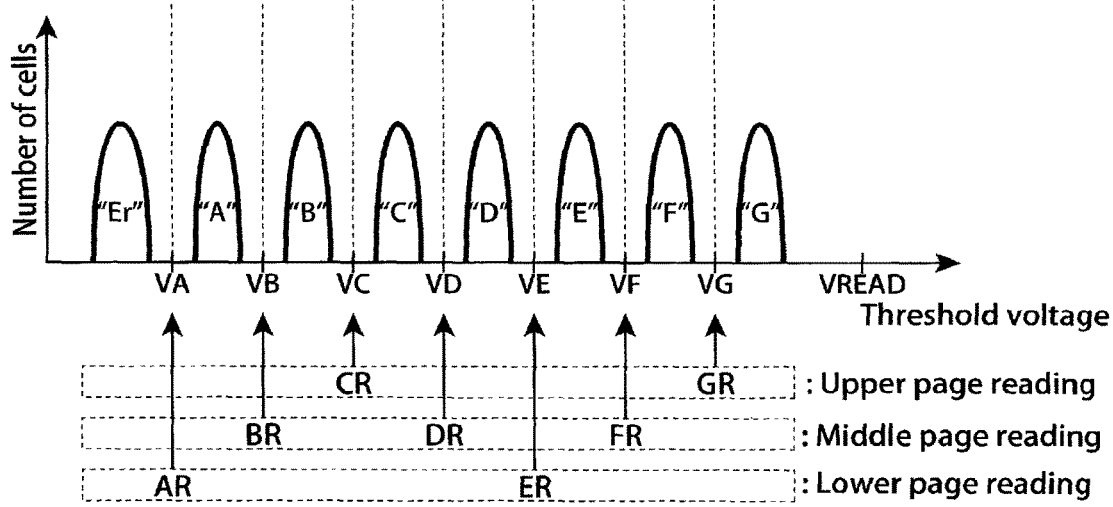
FIG. 4 is a graph showing threshold distribution of memory cells according to the first embodiment.

FIG. 4 is a diagram showing storable data, threshold distribution, and voltages used in reading of memory cell transistors MT.

As shown in FIG. 4, the memory cell transistors MT may take eight states in accordance with their threshold voltages. The eight states will be referred to as an "Er" state, "A" state, "B" state, "C" state, . . . , and "G" state in ascending order of threshold voltage.

The threshold voltages of memory cell transistors MT in the "Er" state are lower than voltage VA, and the "Er" state corresponds to a data-erased state. The threshold voltages of memory cell transistors MT in the "A" state are equal to or higher than voltage VA, and lower than voltage VB (>VA). The threshold voltages of memory cell transistors MT in the "B" state are equal to or higher than voltage VB, and lower than voltage VC (>VB). The threshold voltages of memory cell transistors MT in the "C" state are equal to or higher than voltage VC and lower than voltage VD (>VC). The threshold voltages of memory cell transistors MT in the "D" state are equal to or higher than voltage VD and lower than voltage VE (>VD). The threshold voltages of memory cell transistors MT in the "E" state are equal to or higher than voltage VE and lower than voltage VF (>VE). The threshold voltages of memory cell transistors MT in the "F" state are equal to or higher than voltage VF and lower than voltage VG (>VF). The threshold voltages of the memory cell transistors MT in the "G" state are equal to or higher than voltage VG and lower than voltage VREAD. Of the eight states accordingly distributed, the "G" state is the highest threshold voltage state. Note that voltage VREAD is a voltage applied to non-selected word lines in read operations, and turns on memory cell transistors MT regardless of held data.

The above-described threshold distribution is obtained by writing 3-bit (3-page) data constituted by the above-mentioned lower bit, middle bit, and upper bit. The relationship between the above eight states and the lower bit, middle bit, and upper bit is as follows:

"Er" state: "111" (in the order of "upper/middle/lower")
"A" state: "110"
"B" state: "100"
"C" state: "000"
"D" state: "010"
"E" state: "011"
"F" state: "001"
"G" state: "101"

Only one of the three bits is different between data corresponding to adjacent two states in the threshold distribution.

Accordingly, when the lower bit is read, a voltage corresponding to the boundary where the value ("0" or "1") of the lower bit changes may be used; this also applies when reading the middle bit and the upper bit.

Namely, as shown in FIG. 4, in lower page reading, voltage VA, which distinguishes between the "Er" state and the "A" state, and voltage VE, which distinguishes between the "D" state and the "E" state, are used as read voltages. The read operations using voltages VA and VE will be referred to as read operations AR and ER, respectively.

In middle page reading, voltage VB, which distinguishes between the "A" state and the "B" state, voltage VD, which distinguishes between the "C" state and the "D" state, and voltage VF, which distinguishes between the "E" state and the "F" state, are used as read voltages. The read operations using voltages VB, VD, and VF will be referred to as read operations BR, DR, and FR, respectively.

In upper page reading, voltage VC, which distinguishes between the "B" state and the "C" state, and voltage VG, which distinguishes between the "F" state and the "G" state, are used as read voltages. The read operations using voltages VC and VG will be referred to as read operations CR and GR, respectively.

Data erasing can be performed in units of blocks BLK, or smaller units. An erase method is described in, for example, U.S. patent application Ser. No. 13/235,389 filed on Sep. 18, 2011, titled "NONVOLATILE SEMICONDUCTOR MEMORY DEVICE." An erase method is also described in U.S. patent application Ser. No. 12/694,690 filed on Jan. 27, 2010, titled "NON-VOLATILE SEMICONDUCTOR STORAGE DEVICE." Furthermore, an erase method is described in U.S. patent application Ser. No. 13/483,610 filed on May 30, 2012, titled "NONVOLATILE SEMICONDUCTOR MEMORY DEVICE AND DATA ERASE METHOD THEREOF." The entire contents of those patent applications are incorporated herein by reference.

The memory cell array 110 may have other configurations. A configuration of the memory cell array 110 is described in, for example, U.S. patent application Ser. No. 12/407,403 filed on Mar. 19, 2009, titled "THREE DIMENSIONAL STACKED NONVOLATILE SEMICONDUCTOR MEMORY." A configuration of the memory cell array 110 is also described in U.S. patent application Ser. No. 12/406,524 filed on Mar. 18, 2009, titled "THREE DIMENSIONAL STACKED NONVOLATILE SEMICONDUCTOR MEMORY," U.S. patent application Ser. No. 12/679, 991 filed on Mar. 25, 2010, titled "NON-VOLATILE SEMICONDUCTOR STORAGE DEVICE AND METHOD OF MANUFACTURING THE SAME," U.S. patent application Ser. No. 12/532,030 filed on Mar. 23, 2009, titled "SEMICONDUCTOR MEMORY AND METHOD FOR MANUFACTURING SAME." The entire contents of those patent applications are incorporated herein by reference.

1.1.4 Shift Table

Figure 5:
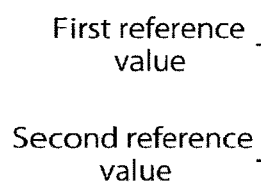

Next, a shift table will be described. As mentioned above, the controller 200 holds a shift table in, for example, the memory 220. A concept of the shift table will be described with reference to FIG. 5. FIG. 5 is a conceptual diagram of an example of the shift table.

As shown in FIG. 5, the shift table includes a plurality of (twelve in the example of FIG. 5) entries. The entries are sequentially assigned with indexes "1" to "12." Each entry holds information indicating a shift amount of the read voltage applied to a selected word line WL in each of the read operations AR, BR, CR, . . . , and GR.

The shift amount will be described below. The threshold distributions corresponding to the "Er" state, "A" state, . . . , and "G" state described in relation to FIG. 4 are apart from one another. Accordingly, the states can be distinguished from one another by voltages VA, VB, . . . , and VG. However, threshold distributions may be shifted to the low voltage side by interference with an adjacent cell (which will be referred to as an inter-cell interference effect) after time has elapsed from data writing. The shift amount increases as the elapsed time increases and as the number of writes in the block increases. Accordingly, adjacent threshold distributions may overlap each other by increase of the distribution width of the threshold distribution of each state.

If the threshold distributions change due to the inter-cell interference effect as described above, data may not be correctly read by the above-mentioned voltages VA, VB, . . . , and VG. Specifically, when the number of error bits included in read data exceeds the number of bits that can be corrected by the ECC circuit 260, a data read results in failure.

In such a case, the controller 200 shifts the read voltages from voltages VA, VB, . . . , and VG (which are referred to as default voltages), and retry a data read. This is called a shift read. Information indicating shift amounts ΔV from default voltages used for the shift read is held in the shift table shown in FIG. 5.

The shift table of this example indicates shift amounts ΔVAj, ΔVBj, . . . , and ΔVGj (where j is an index, i.e., one of natural numbers 1 to 12; which will be collectively referred to as shift amounts ΔV when not distinguished from one another) for respective read operations AR, BR, . . . , and GR. The shift amounts ΔVAj, ΔVBj, . . . , and ΔVGj corresponding to an index j may be all different values, partly the same, or all the same. Those shift amounts ΔV are set at appropriate values as suited by, for example, the controller 200.

According to the shift table of this example, when the influence of the inter-cell interference effect is small, the applied index value is small. Namely, when the influence of the inter-cell interference effect is large, the applied index value is large. Namely, the shift amounts ΔV corresponding to index=1 (i.e., ΔVA1, ΔVB1, . . . , and ΔVG1) are optimized for the case where the influence of the inter-cell interference effect is the smallest. In contrast, the shift amounts ΔV corresponding to index=12 (i.e., ΔVA12, ΔVB12, . . . , and ΔVG12) corresponding to index=12 are optimized for the case where the influence of the inter-cell interference effect is the largest.

The degree of the influence of the inter-cell interference effect may vary depending on which of the "Er" to "G" states the memory cell transistor MT is in. For example, in the case of the inter-cell interference effect where threshold distributions are shifted to the low voltage side as time elapses, which is a focus of the present embodiment, a higher threshold voltage state receives a larger influence. Namely, the inter-cell interference effect has a large influence on read operations GR and FR. On the other hand, the influence on read operations CR and DR does not tend to be very large. Accordingly, for example, the following relationship may hold:

|ΔVG12|>|ΔVG1|

|ΔVG12|>|ΔVC12| and |ΔVD12|

This relationship is merely an example, and the present embodiment is not limited to such a case. The reason for using absolute values is that the shift amounts ΔV take negative values when the influence of the inter-cell interference effect is a threshold change to the negative voltage side. Each shift amount ΔV may of course have a negative value or a positive value, as long as the value is appropriate for a shift read.

The controller 200 also stores one of the indexes as a first reference value, and another one of the indexes as a second reference value. The index determined as the second reference value corresponds to shift amounts for a larger influence of the inter-cell interference effect than the index determined as the first reference value. In the example of FIG. 5, index=7 is the first reference value, and index=10 is the second reference value. The first reference value is used as a criterion to judge whether to perform a refresh read, and the second reference value is used as a criterion to judge whether to perform a block copy operation. The refresh read and block copy will be described later in detail.

The shift table configured as described above and information on which indexes are the first reference value and the second reference value are held in, for example, one block BLK of the NAND flash memory 100. They are read by the controller 200, for example, immediately after the power is turned on, and held in, for example, the memory 220.

1.1.5 History Table

The controller 200 further holds a history table. The history table will be described with reference to FIG. 6. FIG. 6 is a conceptual diagram of an example of the history table.

As shown in FIG. 6, the history table holds a relationship between word lines WL0 to WL7 in each logical block LB, and indexes in the shift table applied to those word lines WL0 to WL7. Hereinafter, each block BLK included in the memory cell array 110 of the NAND flash memory 100 may be referred to as a physical block for distinction from the logical block LB. Note, however, that when a block is merely called "block BLK" herein, the "block BLK" means the physical block.

A unique address is assigned to each physical block BLK. This is called a physical address. In contrast, the host apparatus 300 accesses the controller 200 using a logical address which is different from the physical address. Physical blocks BLK designated by the logical address are a logical block LB which is, for example, a set of a plurality of physical blocks BLK. The relationship between the logical block LB and the physical blocks BLK may always change. For example, when logical block LB0 corresponds to physical blocks BLK0 to BLK3 at a certain point in time, logical block LB0 corresponds to other physical blocks BLK4 to BLK7 at a later point. Therefore, for example, the buffer memory 240 of the controller 200 holds the relationship between a logical address and physical addresses as a logical/physical address conversion table.

The history table holds information on shift amounts $\Delta V$ of read voltages to be applied to each word line WL of the logical block LB by use of, for example, an index. The controller 200 determines read voltages to be applied to the selected word line WL with reference to the history table.

For example, in the example of FIG. 6, index=1 is assigned to word lines WL0 of logical block LB0. This means that when read voltages are applied to word lines WL0 of physical blocks BLK corresponding to logical block LB0, the shift amounts ($\Delta VA1$, $\Delta VB1$, ..., and $\Delta VG1$) corresponding to index=1 in the shift table shown in FIG. 5 are applied to the default values.

The shift amounts designated by the history table are set in the NAND flash memory 100 by the controller 200 by use of, for example, a set feature command. Therefore, the shift amounts $\Delta V$ need not be designated for every read operation. However, when indexes are updated in the history table, the controller 200 resets shift amounts for the NAND flash memory 100. The set feature command is a command that can change various settings, such as a voltage and timing, etc. in the NAND flash memory 100.

The history table configured as described above is held in, for example, one block ELK of the NAND flash memory 100. Then, the history table is read by the controller 200, for example, immediately after the power of the memory system 1 is turned on, and held in, for example, the memory 220. When the power of the memory system 1 is shut off, the history table held in, for example, the memory 220 is written in one block BLK of the NAND flash memory 100. Namely, the history table in the NAND flash memory 100 is updated.

1.1.6 Flag Table

The controller 200 further holds a flag table. The flag table will be described with reference to FIG. 7. FIG. 7 is a conceptual diagram of an example of the flag table.

As shown in FIG. 7, the flag table holds a refresh read flag and a block copy flag for each logical block LB. "1" is set as the refresh read flag and the block copy flag when a refresh read and a block copy are respectively reserved by the controller 200, for example.

The refresh read is an operation for reducing the influence of the inter-cell interference effect described in item 1.1.4. More specifically, for example, an operation similar to the read operation is performed, and a voltage is applied to a word line WL. A read disturb is thereby caused in the memory cell transistor MT, and threshold distributions influenced by the inter-cell interference effect are shifted to the high voltage side. Namely, an attempt to move the threshold distributions closer to ideal states is made. This is the refresh read. In the present embodiment, this operation is called a "refresh read"; however, no data is read from the NAND flash memory 100 to the controller 200. In the refresh read, read data is not transferred from the NAND flash memory 100 to the controller 200.

The block copy is an operation performed when data is difficult to be correctly read by the refresh read or any other means, so as to copy effective data in all the physical blocks BLK corresponding to the logical block LB to other physical blocks BLK. Data in the copy-source physical blocks BLK are all erased.

For each logical block LB, the controller 200 reserves a refresh read when the applied index in the history table exceeds the first reference value ("7" in the example of FIG. 5), and reserves a block copy when the index exceeds the second reference value ("10" in the example of FIG. 5).

The flag table configured as described above is held in, for example, one block BLK of the NAND flash memory 100. Then, like the history table, the flag table is read by the controller 200, for example, immediately after the power of the memory system 1 is turned on, and held in, for example, the memory 220. When the power of the memory system 1 is shut off, the flag table held in, for example, the memory 220 is written in one block BLK of the NAND flash memory 100.

1.2 Read Operation and Refresh Read Operation

Next, a data read operation and refresh read operation according to the present embodiment will be described.

1.2.1 Read Operation

Figure 8:
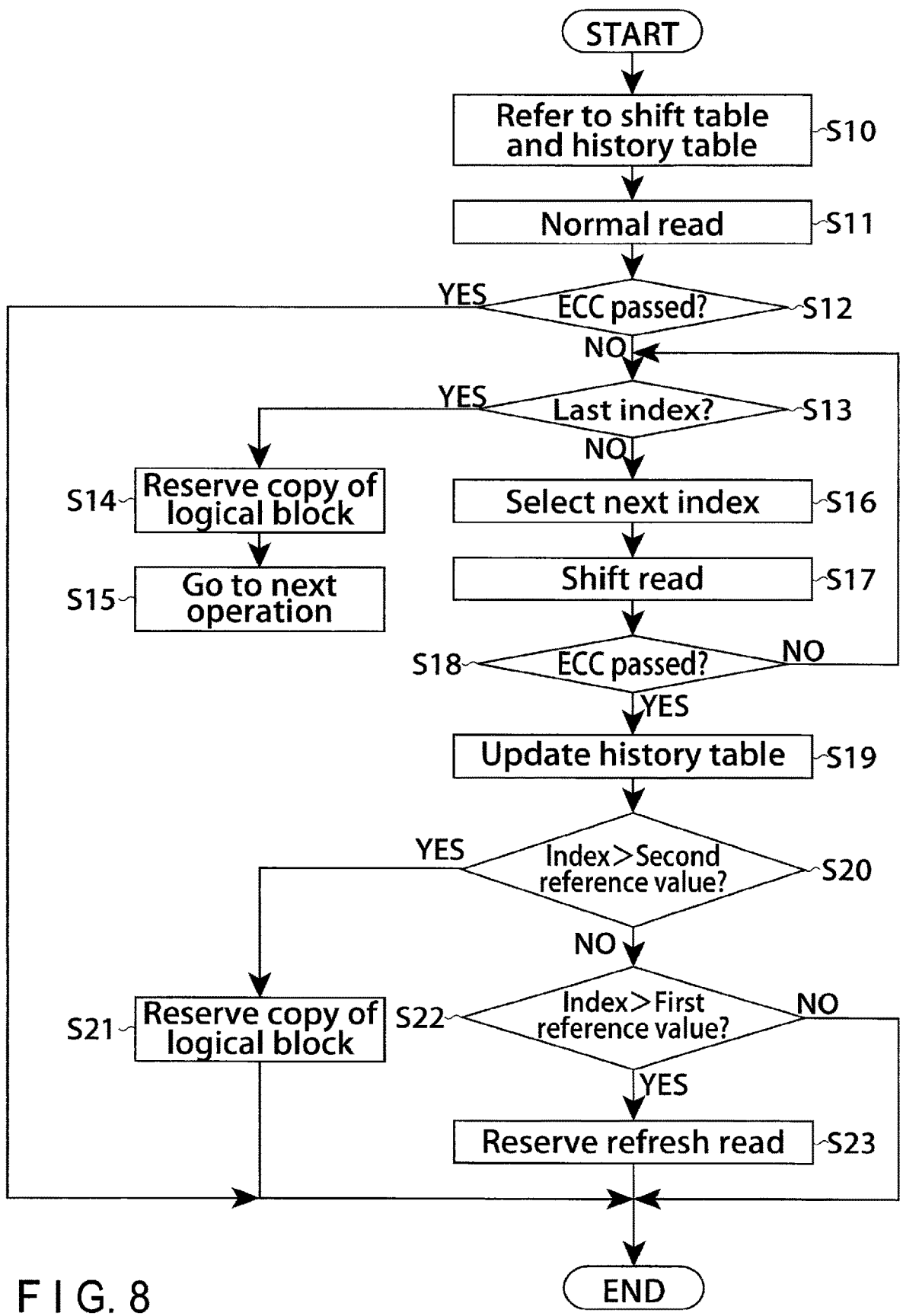
FIG. 8 is a flowchart of the read operation according to the first embodiment.

A flow of the read operation by the controller 200 will be described with reference to FIG. 8. FIG. 8 is a flowchart of the read operation. The operation of the controller 200 in FIG. 8 is executed by control of the processor 230, for example.

Figures 9, 10, 11:
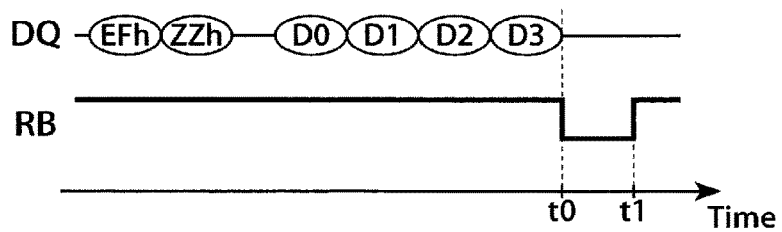
FIG. 9 is a command sequence of set feature according to the first embodiment.
FIGS. 10 and 11 are conceptual diagrams showing information in a register in the NAND flash memory according to the first embodiment.

The controller 200 first refers to the shift table and the history table in the memory 220 (step S10). The controller 200 thereby ascertains shift amounts for each word line WL of each physical block BLK. At a certain time, the controller 200 issues a set feature command, and sets the ascertained shift amounts in the NAND flash memory 100. This process is shown in FIGS. 9 and 10. FIG. 9 is a command sequence of set feature, and FIG. 10 shows an example of information set in the NAND flash memory 100 by the set feature.

Hereinafter, attention is focused on logical block LB0, and the case where logical block LB0 corresponds to four physical blocks BLK0 to BLK3 will be described as an example. The controller 200 recognizes that logical block LB0 corresponds to physical blocks BLK0 to BLK3 based on the logical/physical address conversion table in the memory 220, for example. The controller 200 also ascertains indexes applied to logical block LB0 based on the history table, and recognizes shift amounts to be used in logical block LB0 based on the indexes and the history table.

Then, the controller 200 sets in the NAND flash memory 100 shift amounts to be applied to the physical blocks BLK0 to BLK3 corresponding to logical block LB0, in response to a set feature command. Namely, as shown in FIG. 9, the controller 200 first transmits command "EFh" to the NAND flash memory 100. Command "EFh" is a command that announces a setting change to the NAND flash memory 100. Subsequently, the controller 200 transmits address "ZZh." Address "ZZh" is an address that designates a register that holds setting values to be changed by the set feature command in the NAND flash memory 100. After that, the controller 200 transmits data over four cycles (data "D0" to "D3"). The data "D0" to "D3" includes information on the shift amounts to be applied to physical blocks BLK0 to BLK3.

As a result, information as shown in FIG. 10 is held in the designated register in the NAND flash memory 100. Namely, the register holds shift amounts $\Delta V$ used to perform read operations AR, BR, ..., and GR on word lines WL0 to WL7 of physical blocks BLK0 to BLK3. The driver 130 of the NAND flash memory 100 applies, as read voltages VCGRV, voltages obtained by adding the shift amounts held in the register to the default voltages VA, VB, ..., and VG for reading to a selected word line WL via the row decoder 120. Namely, voltages (VA+$\Delta$VA), (VB+$\Delta$VB), ..., and (VG+$\Delta$VG) become default values of read voltages VCGRV instead of original voltages VA, VB, ..., and VG.

When shift amounts are set directly according to the history table read from the NAND flash memory 100, the set feature command need not necessarily be used. For example, when the power is turned on, the NAND flash memory 100 itself (for example, the sequencer 170) may set the shift amounts shown in FIG. 10 in the register based on the history table and shift table read from the memory cell array 110.

Upon receipt of a data request instruction from the host apparatus 300, the controller 200 issues a normal read command (step S11). The normal read command does not include information on shift amounts of read voltages. Therefore, the NAND flash memory 100 reads data by using default read voltages, and transmits the data to the controller 200. Namely, when, for example, word line WL2 of block BLK0 is selected, voltages (VA+ΔVA7), (VB+ΔVB7), (VC+ΔVC7), . . . , and (VG+ΔVG7) are used as read voltages VCGRV.

In the controller 200 that has received read data from the NAND flash memory 100, the ECC circuit 260 performs error detection. When the read data does not include an error, or an error can be corrected (hard bit decoding) by the ECC circuit 260 (YES in step S12), the data read operation is completed.

When the number of error bits included in the read data exceeds the number of bits that can be corrected by the ECC circuit 260 (NO in step S12), and the history table designates the last index ("12" in the example of FIG. 5) (YES in step S13), the controller 200 reserves a copy operation of a logical block (step S14). Namely, in the flag table, for example, in the memory 220, a block copy flag is set for the logical block LB corresponding to the physical blocks ELK to be read. After step S14, the controller 200 executes some operation for correctly reading data (step S15). The operation is, for example, a Vth tracking operation. The Vth tracking operation is an operation to search for a voltage corresponding to the intersection of overlapping threshold distributions by measuring the number of on-cells (or off-cells) while finely changing the voltage applied to the selected word line WL. The optimal read voltage is determined based on the intersection, and a read operation is performed again.

When the history table does not designate the last index in step S13 (NO in step S13), the controller 200 selects the next index in the shift table (step S16). Then, the controller 200 issues a shift read command based on the selected index (step S17). At such time, for example, the command sequence issued by the controller 200 includes information indicating shift amounts ΔV, and the NAND flash memory 100 determines read voltages VCGRV based on this information. In the above-described example, when word line WL2 of block BLK0 is selected, voltages (VA+ΔVA8), (VB+ΔVB8), (VC+ΔVC8), . . . , and (VG+ΔVG8) are used as read voltages VCGRV.

Then, the controller 200 repeats the shift read (steps S16 and S17) until the selected index reaches the last value (YES in step S13) or error correction is successful (YES in step S18).

When the ECC circuit 260 succeeds in error correction (YES in step S18), the controller 200 updates the history table in the memory 220 (step S19). Namely, in the history table, the index value concerning the word line WL of the logical block LB to be read is changed to the value selected in the latest step S16. The controller 200 also updates information in the register as shown in FIG. 11 by using, for example, the set feature command. FIG. 11 shows an example in which a shift read on word line WL2 is successful when the index is "8." As shown in FIG. 11, the shifts amount ΔVA7, ΔVB7, . . . , and ΔVG7 for word line WL2 are updated to shifts amounts ΔVA8, ΔVB8, . . . , and ΔVG8, respectively.

Subsequently, the controller 200 compares the index selected in step S16 with the second reference value described in FIG. 5 (step S20). When the index is larger than the second reference value (YES in step S20), the controller 200 reserves a copy of the logical block as in step S14 (step S21), and ends the read operation.

On the other hand, when the index is equal to or smaller than the second reference value (NO in step S20), the controller 200 compares the index with the first reference value described in relation to FIG. 5 (step S22). When the index is larger than the first reference value (YES in step S22), the controller 200 reserves a refresh read operation (step S23). Namely, in the flag table in the memory 220, a refresh read flag is set for the logical block LB corresponding to the physical block BLK to be read. Then, the read operation ends. When the index is equal to or smaller than the first reference value (NO in step S22), the controller 200 ends the read operation without setting a refresh read flag.

1.2.2 Refresh Read Operation

A flow of the refresh operation by the controller 200 will be described with reference to FIG. 12. FIG. 12 is a flowchart of the refresh read operation. The operation of the controller 200 in FIG. 12 is executed mainly by control of the processor 230, for example.

The controller 200 confirms the flag table in the memory 220 immediately after data reading described in relation to FIG. 8, or an unoccupied time during processing of the controller 200 after data reading. Then, the controller 200 executes a refresh read operation on a logical block LB for which "1" is set as a refresh read flag.

Namely, as shown in FIG. 12, the controller 200 initializes the number of refresh reads (RD_count=0) (step S30). Subsequently, the controller 200 compares the number of refresh reads with the maximum number of refresh reads (step S31). The maximum number of refresh reads is one or a larger value. Like the shift table and the history table, the maximum number of refresh reads is, for example, read from the NAND flash memory 100 and held in the memory 220.

When the number of refresh reads is smaller than the maximum number of refresh reads (YES in step S31), the controller 200 issues a refresh read command, and transmits it to the NAND flash memory 100 (step S32). The controller 200 also increments the number of refresh reads (RD_count=RD_count+1) (step S33). Then, the processing returns to step S31.

When the number of refresh reads is equal to or larger than the maximum number of refresh reads in step S31 (NO in step S31), the controller 200 updates the history table (step S34), and the refresh read operation ends. Unlike in step S19, the processor 230 updates an index in the history table to a smaller value in step S34. In other words, the processor 230 updates an index to an index corresponding to smaller shift amounts, i.e., an index for dealing with a smaller influence of the inter-cell interference effect. For example, the processor 230 updates an index to the one before the first reference value.

Figure 13:
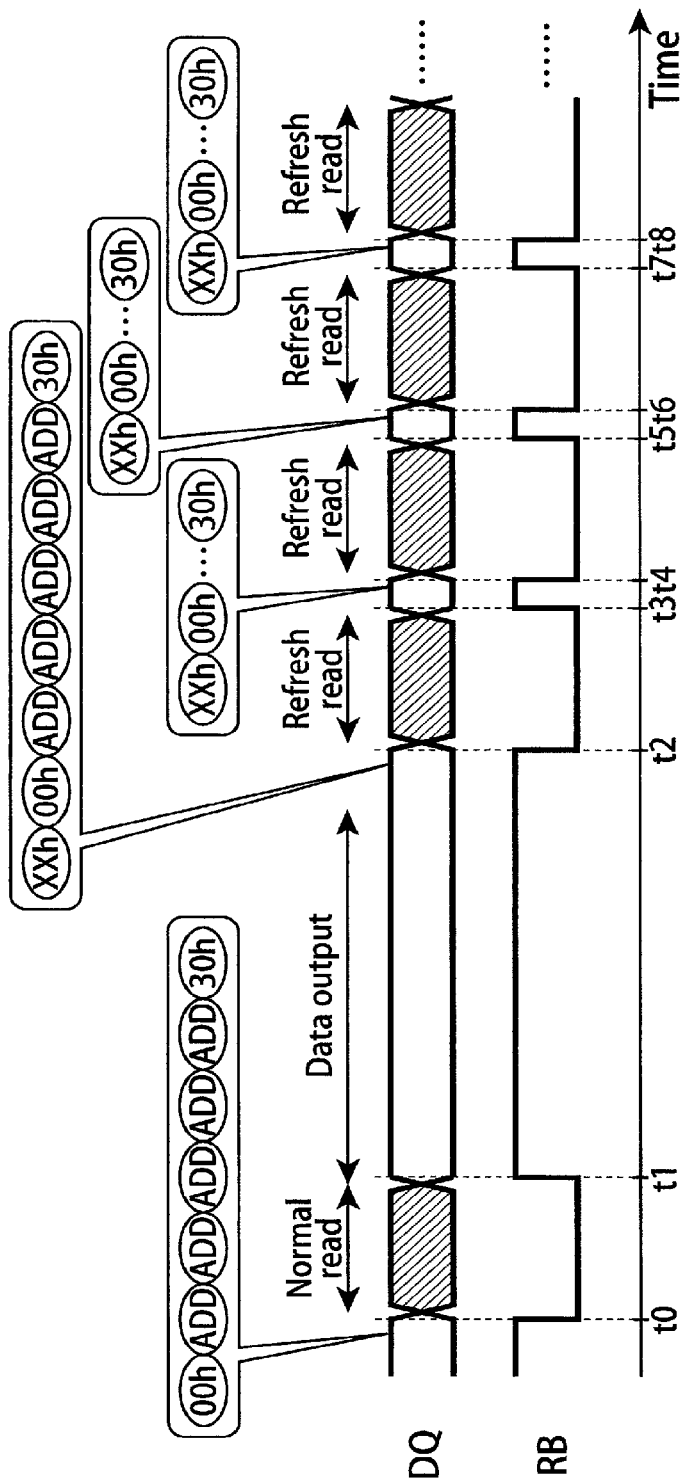
FIG. 13 is a timing chart of various signals in the read operation and the refresh read operation according to the first embodiment.

FIG. 13 is a timing chart of a data signal DQ and a ready/busy signal RB in the normal read operation and the refresh read operation. Signal DQ is a signal transmitted and received between the controller 200 and the NAND flash memory 100, and a command, an address, data, and the like are transmitted and received as signal DQ. Signal RB is a signal transmitted from the NAND flash memory 100 to the controller 200, and is brought to the "H" level (ready state) when the NAND flash memory 100 can receive a command from the controller 200, and to the "L" level (busy state) when the NAND flash memory 100 cannot receive a command.

As shown in FIG. 13, the following command sequence that provides an instruction to perform a normal read is transmitted from the controller 200 to the NAND flash memory 100 at time t0:

<00h> <ADD> <ADD> <ADD> <ADD> <ADD> <30h>

Namely, address input is announced by command "00h," and address ADD is input over five cycles. This address ADD designates a physical block BLK and page to be read. Upon receipt of command "30h," the sequencer 170 starts data reading from a memory cell, and the NAND flash memory 100 changes to the busy state.

Upon completion of data reading from the memory cell, the NAND flash memory 100 changes to the ready state. Then, read data is transmitted to the controller 200 in synchronization with a clock (not shown) transmitted from the controller 200.

When providing an instruction to perform a shift read instead of the normal read the following command sequence, for example, is transmitted from the controller 200 to the NAND flash memory 100:

<X0h> <DAC> <00h> <ADD> <ADD> <ADD> <ADD> <ADD> <30h>

Namely, designation of read voltages is announced by command "X0h," and read voltages VCGRV are designated by data "DAC." Data "DAC" may indicate the read voltages VCGRV themselves, or may indicate shift amounts from the default values. After that, the same command sequence as that of the normal read is transmitted.

Here, let us assume that a refresh read is reserved for the logical block LB from which data was read during time t0 to t1. In this case, after read data is transmitted from the NAND flash memory 100 to the controller 200, the following command sequence that provides an instruction to perform a refresh read is transmitted from the controller 200 to the NAND flash memory 200 at time t2.

<XXh> <00h> <ADD> <ADD> <ADD> <ADD> <ADD> <30h>

This command sequence is a command obtained by adding a prefix command "XXh" before the command sequence that provides an instruction to perform a normal read transmitted at time t0. Command "XXh" provides an instruction to execute a refresh read on a memory cell (block BLK) designated by the subsequent address. Therefore, address "ADD" in five cycles designates the same address as the address "ADD" in the command sequence of the latest normal read or shift read.

In response to this command sequence, the sequencer 170 starts a refresh read, and the NAND flash memory 100 changes to the busy state. After that, every time the NAND flash memory 100 returns to the ready state, the controller 200 instructs the NAND flash memory 100 to repeat a refresh read until the number of refresh reads reaches the maximum number of refresh reads. Note that, unlike in the normal read, read data is not transmitted to the controller 200 in the refresh read as shown in FIG. 13.

1.2.3 Operation of NAND Flash Memory

Next, an operation of the NAND flash memory 100 performed during each of the above-described normal read, shift read, and refresh read will be described while focusing particular attention on the memory cell array 110.

Figure 14:
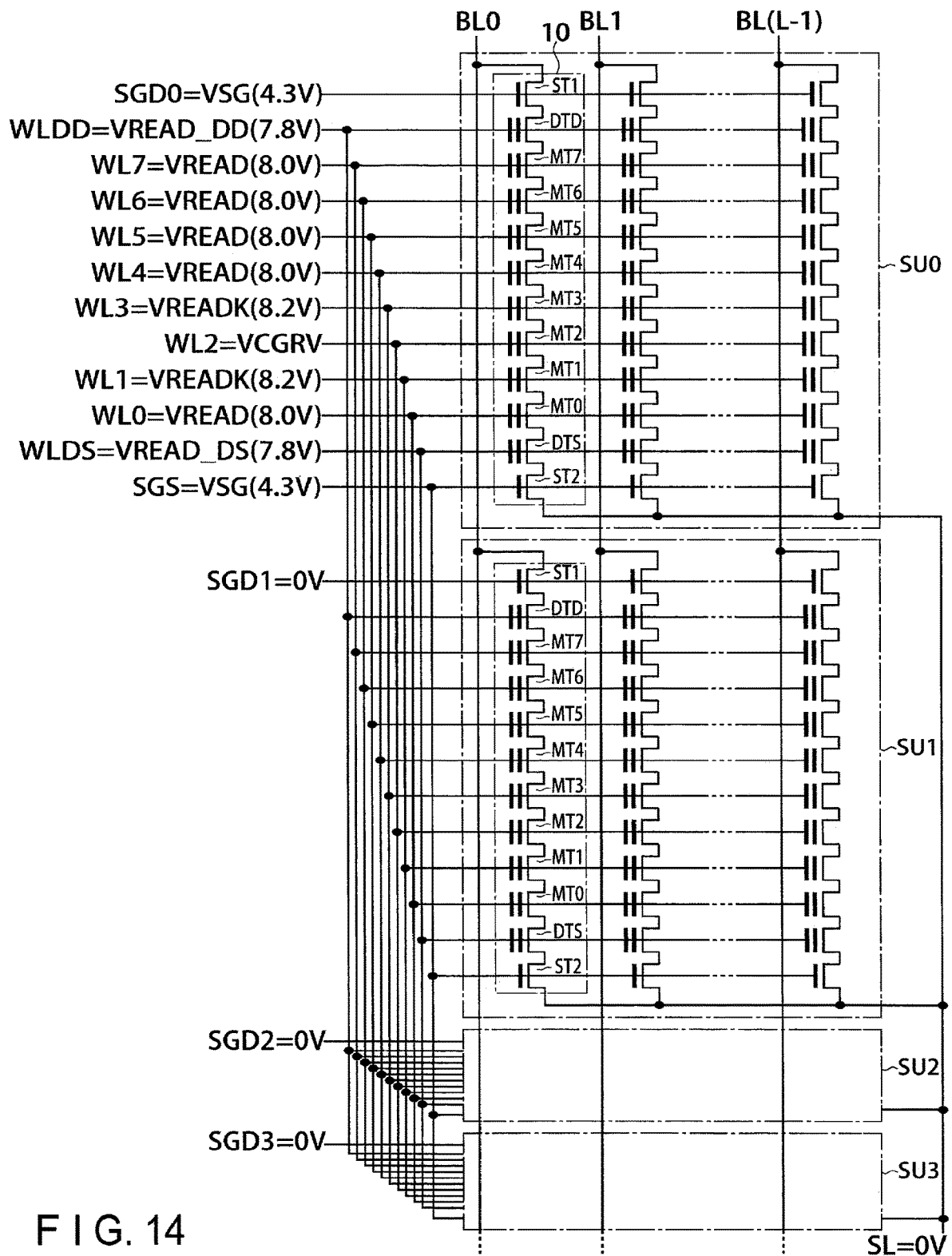

First, the operation during the normal read and the shift read will be described with reference to FIG. 14. FIG. 14 shows, as an example, a case where data is read from memory cell transistor MT2 in string unit SU0 of physical block BLK0.

As shown in FIG. 14, voltage VSG (for example, 4.3V) is applied to selection gate lines SGD0 and SGS0. Voltage VSG is a voltage that turns on selection transistors ST1 and ST2.

Voltages VREAD_DD and VREAD_DS (for example, 7.8V) are applied to dummy word lines WLDD and WLDS, respectively. Voltages VREAD_DD and VREAD_DS are voltages that turn on dummy transistors DTD and DTS, respectively.

Voltage VREAD (for example, 8.0V) is applied to the non-selected word lines WL0, WL4, WL5, . . . , and WL7 not adjacent to the selected word line WL2. Voltage VREADK (for example, 8.2V) is applied to the non-selected word lines WL1 and WL3 adjacent to the selected word line WL2. Voltages VREAD and VREADK are voltages that turn on memory cell transistors MT regardless of held data.

Read voltages VCGRV are applied to the selected word line WL2. For example, when the lower page is read, voltages (VA+ΔVA) and (VE+ΔVE) are used as voltages VCGRV. ΔVA and ΔVE are shift amounts from the default values.

A pre-charge voltage Vpre (for example, 0.7V) is applied to the bit lines BL, and the source line SL is brought to 0V. Accordingly, read operation AR is performed during a period in which voltage (VA+ΔVA) is applied as voltage VCGRV, and read operation ER is performed during a period in which voltage (VE+ΔVE) is applied as voltage VCGRV.

Specifically, when memory cell transistor MT2 is turned on, a cell current flows from the bit line BL to the source line SL, and when it is off, a cell current does not flow (Only a slight leak current flows). The sense amplifier 140 senses the current that flows in the bit line BL, or the potential of the bit line BL, determines whether the data held in memory cell transistor MT2 is "0" or "1," and holds the data in an internal latch circuit. After the sense amplifier 140 performs a necessary arithmetic operation on the read data, the data is transmitted to the controller 200.

In the non-selected string units SU1 to SU3, 0V is applied to the selection gate lines SGD1 to SGD3 and SGS1 to SGS3, and selection transistors ST1 and ST2 are turned off.

Next, the operation during the refresh read will be described with reference to FIG. 15. As shown in FIG. 15, voltage VREAD is applied to all the word lines WL0 to WL7. All the memory cell transistors MT0 to MT7 in block BLK0 are thereby turned on regardless of held data. The other part of the operation is the same as the operation performed during the normal read and the shift read. Note, however, that the refresh read is not an operation for reading data from a memory cell transistor MT, and the sense amplifier 140 need not sense the potential change of the bit line BL as read data. In the refresh read, the bit line BL need not necessarily have the pre-charge potential as long as the memory cell transistor MT is provided with a voltage stress similar to a read disturb and, for example, 0V or any other fixed voltage may be applied to the bit lines BL.

1.2.4 Specific Examples

Next, specific examples of the case where a refresh read is executed and the case where a block copy is executed in FIG. 8 will be briefly described.

<Refresh Read>

First, the case where a refresh read is performed will be described with reference to FIG. 16. Described below as an example is the case where lower page data is read from memory cell transistor MT2 in physical block BLK0 corresponding to logical block LB0.

First, the NAND flash memory 100 performs a normal read in response to a normal read command from the controller 200 (step S11). At this time, as described in relation to FIGS. 6 and 7, the index corresponding to word line WL2 of logical block LB0 is "7"; therefore, shift amounts ΔVA7 and ΔVE7 held in the shift table are selected. Namely, in the NAND flash memory 100, the driver circuit 130 applies voltages (VA+ΔVA7) and (VE+ΔVE7) to selected word line WL2 in respective read operations AR and ER.

When data read in step S11 is transmitted to the controller 200, the ECC circuit 260 attempts error correction. When the ECC circuit 260 fails in the error correction (step S12), the controller 200 selects the next index, i.e., (7+1)=8 (step S16). Then, the controller 200 issues a shift read command, and the NAND flash memory 100 executes a shift read (step S17). At this time, the controller 200 instructs the NAND flash memory 100 to use shift amounts ΔVA8 and ΔVE8 corresponding to index value=8 in the shift table. In accordance with the instruction, in the NAND flash memory 100, the driver circuit 130 applies voltages (VA+ΔVA8) and (VE+ΔVE8) to selected word line WL2 in respective read operations AR and ER.

When read data read in step S17 is transmitted to the controller 200, the ECC circuit 260 attempts error correction again. When the ECC circuit 260 succeeds in error correction (step S18), the controller 200 updates the history table in the memory 220 (step S19). Namely, the controller 200 updates the index corresponding to word line WL2 from "7" to "8." That is, the values shifted by the shift amounts corresponding index=8 will be hereafter used as default values of read voltages VCGRV.

Subsequently, the controller 200 compares the index with the second reference value (step S20). The index was updated from "7" to "8" in step S19. The second reference value is "10." Therefore, the index is smaller than the second reference value. Consequently, a block copy is not performed.

Subsequently, the controller 200 compares the index with the first reference value (step S22). The index is "8" as mentioned above, and the first reference value is "7." Therefore, the index is larger than the first reference value. Accordingly, the controller 200 sets a refresh flag for logical block LB0 in the flag table in the memory 220 (step S23).

After that, the controller 200 issues a refresh read command in an unoccupied time during processing and, in response thereto, the NAND flash memory 100 executes a refresh read until the number of refresh reads reaches the maximum number of refresh reads (step S32). Namely, voltage VREAD is applied to all the word lines WL in the selected block BLK. The controller 200 also updates the history table in the memory 220 (step S34). Namely, the index is updated from "8" to, for example, the index "6" which is the one before the first reference value.

<Block Copy>

Next, the case where a block copy is executed will be described with reference to FIG. 17. Described below as an example is the case where lower page data is read from memory cell transistor MT7 in any one of physical blocks BLK4 to BLK7 corresponding to logical block LB1.

Figure 16:
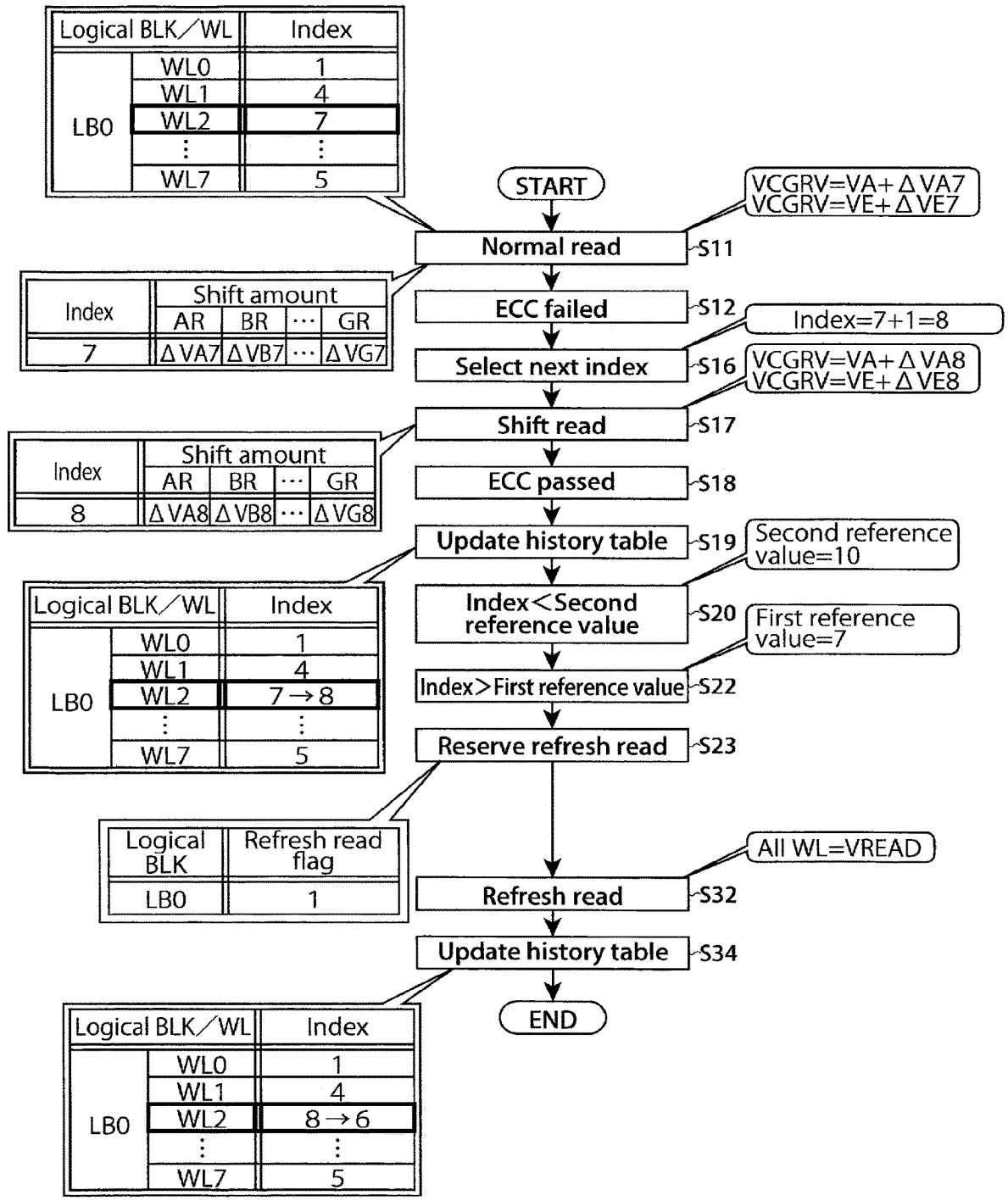
FIG. 16 is a flowchart of a read operation and a refresh read operation according to the first embodiment.

As in the case of FIG. 16, the NAND flash memory 100 first performs a normal read (step S11). At this time, as described in relation to FIGS. 6 and 7, the index corresponding to word line WL7 of logical block LB1 is "10"; therefore, shift amounts ΔVA10 and ΔVE10 held in the shift table are selected.

When error correction on read data read in step S11 ends in failure (step S12), the controller 200 selects the next index, i.e., (10+1)=11 (step S16). Then, the controller 200 issues a shift read command, and the NAND flash memory 100 executes a shift read (step S17). The shift amounts used at this time are shift amounts ΔVA11 and ΔVE11 corresponding to index=11.

When error correction of read data read in step S17 is successful (step S18), the controller 200 updates the history table in the memory 220 (step S19). Namely, the controller 200 updates the index corresponding to word line WL7 from "10" to "11."

Subsequently, the controller 200 compares the index with the second reference value (step S20). The index was updated from "10" to "11" in step S19. The second reference value is "10." Therefore, the index is larger than the second reference value. Accordingly, the controller 200 sets a block copy flag for logical block LB1 in the flag table in the memory 220 (step S21).

After that, the controller 200 issues a block copy command in an unoccupied time during processing and, in response thereto, the NAND flash memory 100 executes a block copy (step S42). Namely, the NAND flash memory 100 copies the effective data held in the physical blocks BLK4 to BLK7 corresponding to logical block LB1 to physical blocks BLK8 to BLK11 from which data has been erased. Then, the NAND flash memory 100 erases all data in physical blocks BLK4 to BLK7, and the controller 200 thereafter assigns physical blocks BLK8 to BLK11 to logical block LB1.

The controller 200 also updates the history table (step S43). Namely, the controller 200 initializes the indexes corresponding to logical block LB1. In the case shown in FIG. 17, the index values of all the word lines WL0 to WL7 are changed to "0." "0" means, for example, shift value="0." Alternatively, the indexes of all the word lines WL0 to WL7 may be changed to the minimum value "1."

1.3 Advantage According to Present Embodiment

According to the present embodiment, operation reliability of the memory system can be improved. This advantage will be described with reference to FIG. 18. FIG. 18 shows changes in the threshold distribution of memory cells.

The first state in FIG. 18 is threshold distribution immediately after data writing. The first state is an ideal state in which the threshold distributions are apart from one another. The second state is threshold distribution after a certain time has elapsed from the first state. As shown in FIG. 18, threshold distributions are shifted to the low voltage side due to the above-described inter-cell interference effect. This is because, for example, electrons injected in the charge accumulation layer move to the region between memory cell transistors, and the number of electrons in the charge accumulation layer of the memory cell transistor MT substantially decreases. Therefore, the controller 200 deals with this inter-cell interference effect by a shift read.

In the present embodiment, to deal with the inter-cell interference effect, a refresh read is performed when shift amounts of read voltages VCGRV (i.e., index) exceed the first reference value. The refresh read is an operation to apply voltage VREAD to all the word lines WL as described in FIG. 15. A voltage stress is thereby applied to the memory cell transistors MT, and threshold distributions are shifted to the high voltage side as in the third state shown in FIG. 18.

Namely, the changes of threshold distributions from the first state to the second state can be at least partly canceled by the refresh read.

According to the present embodiment, threshold distribution of memory cell transistors MT (i.e., reliability of held data) is determined based on the index, as described above. When the threshold distribution (index) falls lower than a fixed reference value, a refresh read is performed. Reliability of data held in memory cell transistors MT is thereby improved, and the number of error bits at the time of reading can be reduced. As mentioned above, reading of data from the memory cell array 110 to the sense amplifier 140 is not necessary in the refresh read operation and, even if data is read, the data is not needed to be transmitted to the controller 200. This is because the refresh read operation is an operation to shift threshold distributions by applying a voltage stress to the memory cell transistors MT, rather than an operation to read data. Therefore, the refresh read operation can be called, for example, a threshold distribution shift operation, a threshold correction operation, a stress application operation, or a read disturb application operation.

Furthermore, when the number of error bits becomes very large, and correction by the ECC circuit 260 becomes almost impossible, the controller 200 performs a copy operation to copy the logical block LB. However, in general, this copy operation is performed on a very large number of physical blocks (for example, 128 blocks BLK), which places a heavy load on the memory system 1.

According to the present embodiment, however, threshold distributions are corrected by the above-described refresh read. Therefore, the frequency of the copy operation can be reduced, and operation reliability of the memory system can be improved.

In the present embodiment, the case where threshold distributions are shifted to the low voltage side due to the inter-cell interference effect has been described as an example. However, the inter-cell interference effect may have various mechanisms. For example, the inter-cell interference effect may be caused by threshold change amount(s) of memory cell transistor(s) MT(i−1) and/or MT(i+1) adjacent to memory cell transistor MTi (i is an integer equal to or larger than 0) which are produced after memory cell transistor MTi passes a program verification. In this case, the threshold voltage of memory cell transistor MTi is shifted to the high voltage side. The lower ("Er" state) the threshold voltage of memory cell transistor MTi to be read is, and the higher the threshold voltage(s) of the adjacent memory cell transistor(s) MT(i−1) and/or MT(i+1) is(are), the larger the change amount of the threshold voltage of memory cell transistor MTi tends to be.

In the above-described embodiment, from when a refresh read is reserved in step S23 of FIG. 8 to when the refresh read is actually performed, a data write operation and erase operation are not executed on the page read in steps S11 and S17. This is because data writing is performed on memory cell transistors MT from which data has been erased, and data is not written in the page in which data has been written. In addition, if an erase operation is executed, a refresh read no longer needs to be performed on the page (and the block BLK including the page). Namely, after a refresh read is reserved, the refresh read is performed unless an erase operation or a write operation (which includes a data erase operation) on the page is executed. However, a read operation may be performed on the page and the block BLK. In addition, a write operation and an erase operation on the other blocks BLK may be performed, and a write operation may be performed on the other string units SU.

Therefore, the shift table may take into account such an influence of the inter-cell interference effect. For example, the shift table may have some indexes associated with shift amounts set by particularly focusing attention to the shift to the high voltage side as described in the above embodiments, some other indexes associated with shift amounts set by particularly focusing attention to the shift to the low voltage side, and some other indexes associated with shift amounts set by focusing attention to both of the shifts.

2. Second Embodiment

The memory system according to the second embodiment will be described. In the present embodiment, a desired index is set after performing a refresh read and then updating the history table in the first embodiment, and whether data can be read with the index is confirmed. In the following description, only the matters different from the first embodiment will be described.

2.1 Refresh Read Operation

The refresh read operation according to the present embodiment will be described with reference to FIG. 19. FIG. 19 is a flowchart of the refresh read operation, and corresponds to FIG. 12 described in the first embodiment. As in FIG. 12, the operation of the controller 200 in FIG. 19 is executed mainly by control of the processor 230, for example.

As shown in FIG. 19, the controller 200 initializes the number of refresh reads in step S30 (RD_count=0), and initializes the number of repeats of the shift read (Repeat_count=0) (step S35). Subsequently, the controller 200 compares the number of repeats of the shift read with the maximum number of shift reads (step S36). The maximum number of shift reads is one or a larger value, and is, for example, read from the NAND flash memory 100 and held in the memory 220 like the shift table and the history table.

When the number of repeats of the shift read is equal to or larger than the maximum number of shift reads in step S36 (NO in step S36), the controller 200 ends the refresh read operation.

On the other hand, when the number of repeats is smaller than the maximum number of shift reads in step S36 (YES in step S36), the controller 200 compares the number of refresh reads with the maximum number of refresh reads (step S31).

When the number of refresh reads is smaller than the maximum number of refresh reads (YES in step S31), a refresh read is repeated until the number of refresh reads reaches the maximum number as in the first embodiment (steps S32 and S33).

When the number of refresh reads is equal to or larger than the maximum number of refresh reads in step S31 (NO in step S31), the controller 200 instructs NAND flash memory 100 to perform a shift read with a target index (step S37). The target index is a value equal to or smaller than the first reference value, and a shift read is performed by using shift amounts corresponding to the target index in step S37.

When the ECC circuit 260 succeeds in error correction on data read in step S37 (YES in step S38), the processor 230 updates the index value in the history table to the target index used in S37 (step S34), and ends the refresh read operation.

On the other hand, when error correction ends in failure (NO in step S38), the controller 200 increments the number of repeats of the shift read (Repeat_count=Repeat_count+1) (step S39), and the processing returns to step S36.

2.2 Specific Examples

Figure 20:
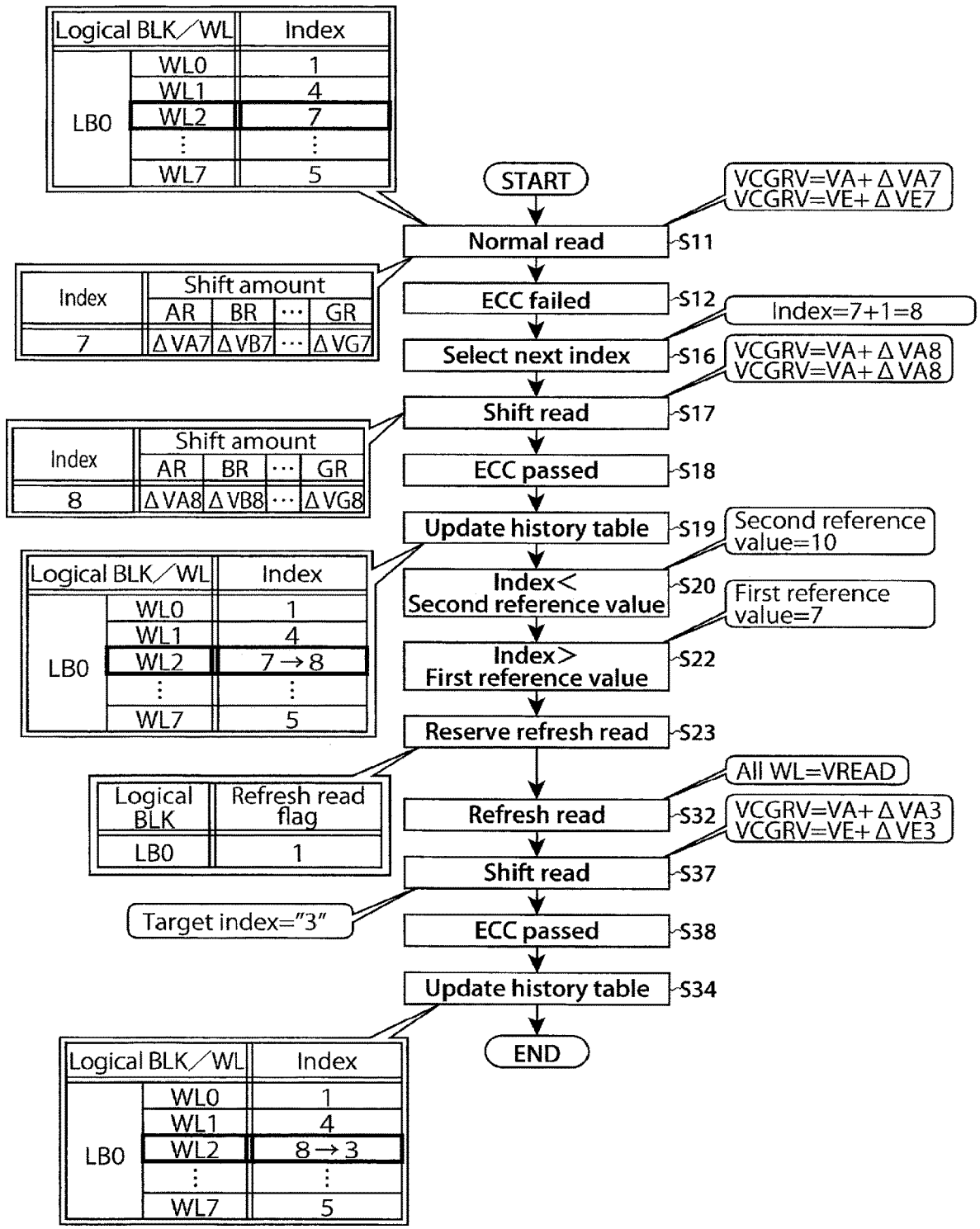
FIG. 20 is a flowchart of a read operation and a refresh read operation according to the second embodiment.

A specific example of the refresh read operation according to the present embodiment will be described with reference to FIG. 20. FIG. 20 corresponds to FIG. 16 described in the first embodiment, and shows the case where lower page data is read from memory cell transistor MT2 in a physical block BLK corresponding to logical block LB0.

As shown in FIG. 20, the processing until step S23 is the same as that in FIG. 16 described in the first embodiment. Namely, the index for word line WL0 of logical block LB0 is changed to "8" to exceed the first reference value, and a refresh read is reserved.

In step S32, a refresh read is repeated until the number of refresh reads reaches the maximum number of refresh reads (step S32) and then, in step S37, a shift read is performed. Here, let us assume that the processor 230 selects "3" as the target index, for example. In the NAND flash memory 100, the driver circuit 130 applies voltages (VA+ΔVA3) and (VE+ΔVE3) to selected word line WL2 in respective read operations AR and ER. Namely, at this point in time, information in the history table (index="8") does not match the index used in the NAND flash memory 100 (target index="3").

As a result of performance of the combination of the refresh read in step S32 and the shift read in step S37 once or multiple times, the ECC circuit 260 succeeds in error correction (step S38). The processor 230 then updates the index value in the history table from "8" to the target index "3" (step S34), and the refresh read operation is completed.

2.3 Advantage According to Present Embodiment

According to the present embodiment, operation reliability of the memory system can be further improved. Namely, according to the present embodiment, a shift read is performed after refresh read(s) and, after confirming that data can be correctly read, the index in the history table is updated. Therefore, reliability of the history table updated in step S34 can be improved.

In addition, when data cannot be correctly read by the target index, the history table is not updated. Therefore, application of the present embodiment is preferable when the controller 200 is expected to set a value significantly smaller than the first reference value as the target index, i.e., when the shift amounts for compensating for an influence of the inter-cell interference effect are desired to be updated to relatively small values.

Even when error correction ends in failure by setting a value significantly smaller than the first reference value as the target index, the threshold distribution is expected to be shifted to the high voltage side to a certain extent by refresh read(s). Therefore, the index may be updated to a value ("7") equal to the first reference value as in the first embodiment, or a close value (such as "5" or "6") in the history table.

3. Third Embodiment

Next, the memory system according to the third embodiment will be described. In the present embodiment, the refresh read operation described in the above second embodiment is executed immediately after the data read operation. In the following description, only the matters different from the first and second embodiments will be described.

3.1 Read Operation and Refresh Read Operation

FIG. 21 is a flowchart of the read operation and refresh read operation according to the present embodiment. As shown in FIG. 21, the refresh read operation according to the present embodiment is executed as a part of the read operation. In other words, a refresh read is performed every time a shift read ends in failure.

Namely, as shown in FIG. 21, when the data is failed to be corrected in the shift read in step S17 (NO in step S18), the controller 200 compares the index with the first reference value (step S22). When the index is equal to or smaller than the first reference value (NO in step S22), the processing returns to the judgment in step S13. If the index is larger than the first reference value (YES in step S22), the controller 200 executes a refresh read operation (step S50).

The refresh read operation S50 is almost the same as that in FIG. 19 described in the second embodiment, but is different from that in the second embodiment in the following respects:

When the number of repeats of the shift read with the target index reaches the maximum value in step S36 (NO in step S36), the processing returns to step S13.

When error correction succeeds in the shift read with the target index in step S37 (YES in step S38), the process proceeds to step S19, and the index in the history table is updated to the target index.

After step S19, the index value is compared with the second reference value in step S20, and a copy of the logical block is reserved in accordance with the comparison result (step S21), whereby the read operation is completed.

3.2 Advantage According to Present Embodiment

According to the present embodiment, when a shift read results in failure (NO in steps S17 and S18), and the index is equal to or larger than the first reference value, a refresh read is executed immediately after the shift read. Accordingly, a refresh read operation may be performed as a part of a data read operation.

The shift read in step S37 of the second embodiment is merely an operation for confirming whether the target index is appropriate or not. Data read and error-corrected in step S17 is transmitted to the host apparatus 300.

In contrast, according to the present embodiment, when the shift read in step S17 ends in failure, and the shift read in step S37 is successful, data error-corrected in steps S37 and S38 is transmitted to the host apparatus 300. The number of repeats compared in step S36 is not the number of repeats of the shift read executed in step S17, but the number of repeats of the shift read executed in step S37.

4. Modifications, etc.

As described above, the memory system 1 according to the above-described embodiments includes: a semiconductor memory including a memory cell array including a first memory cell and a second memory cell configured to hold data and are coupled to a first word line and a second word line, respectively; and a controller configured to control the semiconductor memory. The memory system is capable of executing a first operation (read operation) and a second operation (refresh read operation) after the first operation. In the first operation (read operation), the controller issues a first command sequence (00h-ADD-30h) and, in response to the first command sequence, the semiconductor memory applies a first voltage (VCGRV) to the first word line (WL2 in FIG. 14) and applies a second voltage (VREAD) to the second word line (WL4-7 in FIG. 14) to read data from the first memory cell (MT1 in FIG. 14). The read data is transmitted from the semiconductor memory to the controller (normal read or shift read). In the second operation (refresh read operation), the controller issues a second command sequence (XXh+1st sequence) and, in response to the second command sequence, the semiconductor memory applies a third voltage (VREAD or VREADK or plus α) to the first word line (WL2 in FIG. 15) and applies a fourth voltage (VREAD or VREAD plus α) to the second word line (WL4-7 in FIG. 15). The data held in the memory cell array is left untransmitted to the controller (refresh read). The second operation (refresh read operation) is executed after the first operation (read operation) without intervention of a write operation and erase operation on the first memory cell. The third voltage (VREAD) turns on the first memory cell regardless of data held in the first memory cell, and the second voltage (VREAD or VREADK) and the fourth voltage (VREAD) turn on the second memory cell regardless of data held in the second memory cell.

Figure 22:
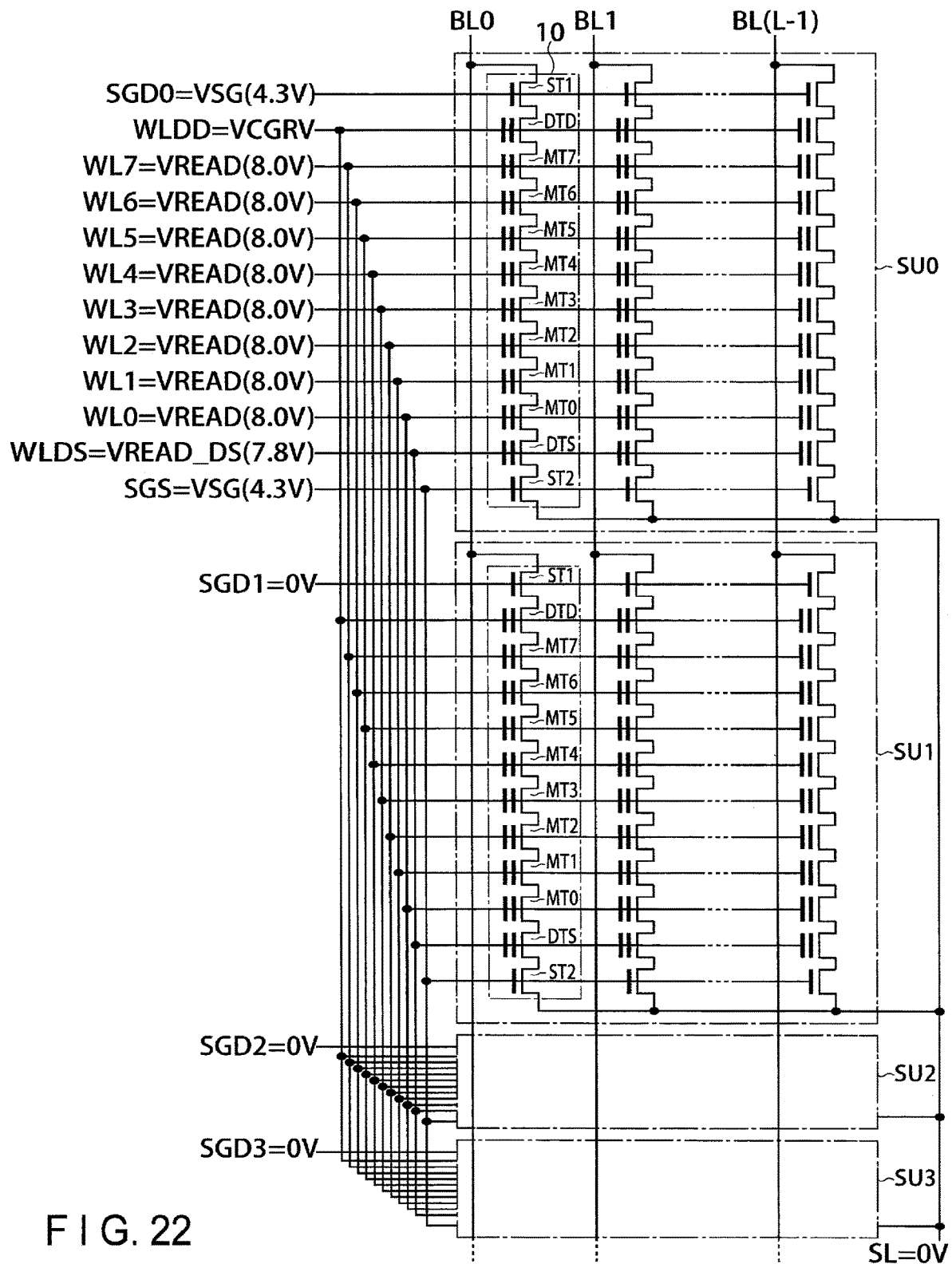

This configuration enables correction of threshold changes of memory cells involved with an elapse of time, thereby improving reliability of the operations of the memory system 1. The above-described embodiments are mere examples, and various modifications are possible. For example, described in the above-described embodiments as an example is the case where voltage VREAD is applied with no word line WL selected in a refresh read. However, for example, a dummy word line may be selected. Such an example is shown in FIGS. 22 and 23. FIGS. 22 and 23 are circuit diagrams of a block BLK in a refresh read.

In the example of FIG. 22, the dummy word line WLDD on the drain side is selected, and voltage VCGRV is applied thereto. In the example of FIG. 23, the dummy word line WLDS on the source side is selected, and voltage VCGRV is applied thereto. The potentials of the other lines are as described in relation to FIG. 15. The value of voltage VCGRV is not particularly limited. The value of voltage VCGRV may be any value that can provide memory cell transistors MT with a read disturb, and may be, for example, one of voltages VA, VB, . . . , and VG, or may be multiple values (such as VA and VE for lower voltage page reading, VB, VD, and VF for middle page reading, and VC and VG for upper page reading) as in normal page data reading. In this case, the controller 200 issues, for example, the following command sequence:

<YYh> <00h> <ADD> <ADD> <ADD> <ADD> <ADD> <30h>

Namely, prefix command "YYh" is added at the top of the normal read sequence. This "YYh" provides an instruction to select a dummy word line. At this time, "ADD" indicates the block BLK designated in the latest normal read or shift read as in the above-described embodiments. Alternatively, "ADD" may include information indicating which of the dummy word line WL_DD on the drain side and the dummy word line WL_DS on the source side should be selected as well as information indicating the block BLK.

The refresh read may be the same operation as the normal read operation as shown in FIG. 14. Namely, the refresh read may be an operation in which one word line WL is selected and voltage VCGRV is applied thereto, and voltage VREAD is applied to the other non-selected word lines WL. The value of VCGRV in this case may also be one of voltages VA, VB, . . . , and VG (or values obtained by adding shift amounts designated in the shift table to those voltages), or may be multiple values as in normal page data reading. In this case, the controller 200 issues, for example, the following command sequence:

<XYh> <00h> <ADD> <ADD> <ADD> <ADD> <ADD> <30h>

Namely, prefix command "XYh" is added at the top of the normal read sequence. This "XYh" announces a refresh read. At this time, "ADD" indicates a block BLK and page designated in the latest normal read or shift read as in the above-described embodiments. Therefore, the NAND flash memory 100 that has received this command sequence applies a voltage to the word lines WL like in the normal read or shift read, but does not perform, by the sense amplifier 140, a data sense operation or data transfer to the controller 200.

Figure 24:
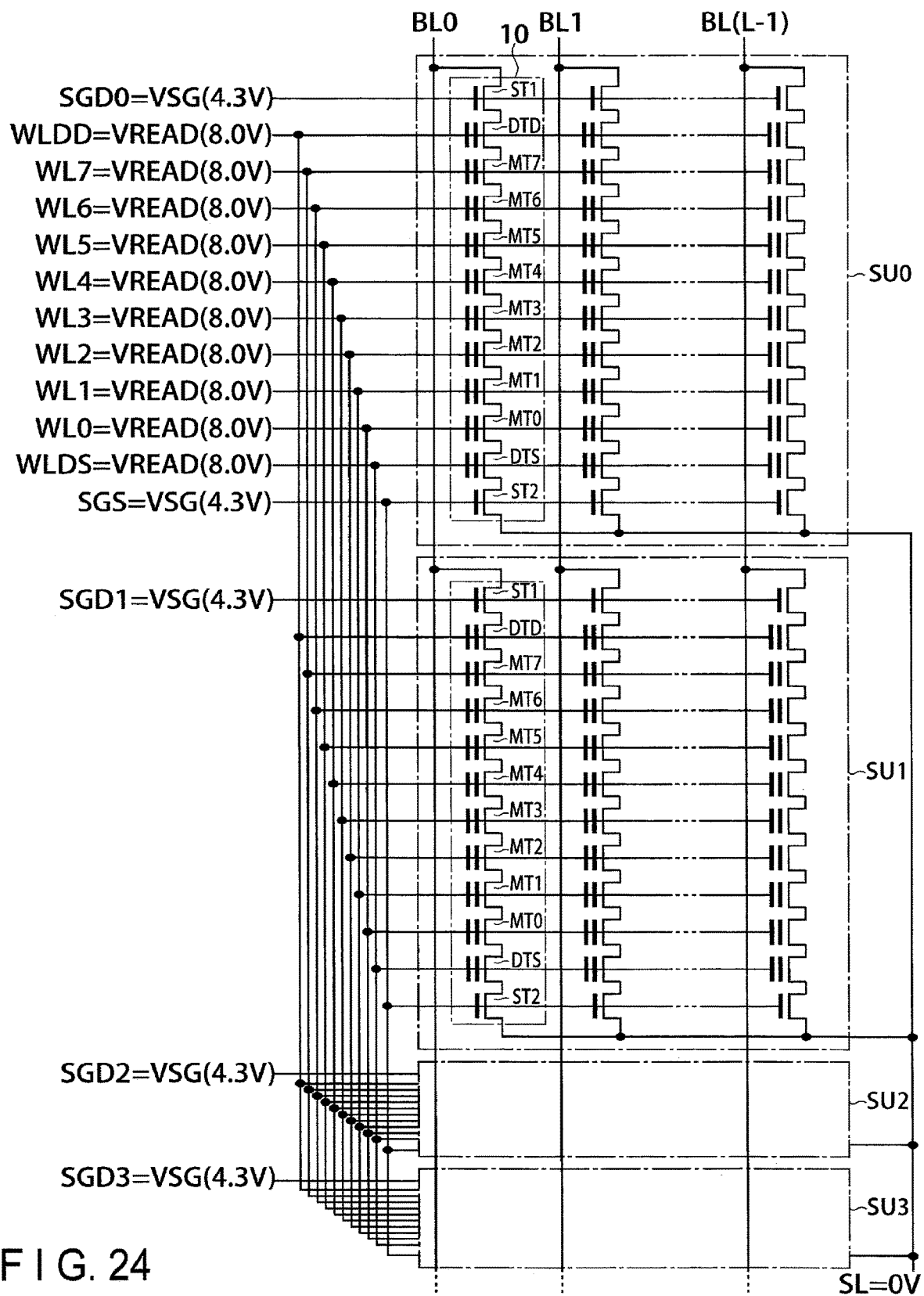

Furthermore, the refresh read may be executed with a plurality of string units SU selected. FIG. 24 shows, as an example, the case where all string units SU0 to SU3 in a selected block BLK are selected in the refresh read of FIG. 14 described in the first embodiment. As shown in FIG. 24, voltage VSG is applied not only to selection gate line SGD0, but also to selection gate lines SGD1 to SGD3, and selection transistors ST1 in string units SU1 to SU3 are turned on. In this case, for example, the following command sequence is transmitted from the controller 200 to the NAND flash memory 100:

<XXh> <YZh> <00h> <ADD> <ADD> <ADD> <ADD> <ADD> <30h>

Namely, in the second cycle, for example, of the command sequence of a refresh read described in the first embodiment, a command "YZh" for selecting a plurality of string units SU is transmitted. Needless to say, the command sequence is not limited to this sequence, and a similar instruction may be transmitted by, for example, replacing "XXh" with another command.

This is applicable to the case where dummy word line WLDD or WLDS is selected which is described in relation to FIGS. 22 and 23, and the case where one word line WL is selected. In those cases, command "YZh" may be issued in, for example, the second cycle. FIG. 24 shows the case where all string units SU0 to SU3 in a block BLK are selected; however, all the string units need not be necessarily selected, and some string units SU may be selected. In this case, for example, another command may be prepared instead of command "YZh," or a command designating which string units SU should be selected may be issued after command "YZh."

Moreover, a refresh read may be performed on another physical block BLK belonging to the same logical block LB. This is because indexes are assigned to each logical block LB in the example (FIG. 6) of the above-described embodiments. However, indexes need not necessarily be assigned to each logical block LB, and may be assigned to each physical block ELK, or each set of physical blocks.

In addition, in the example of FIG. 6, an index is assigned to each word line WL. However, one index may be assigned to each physical block BLK, or may be assigned to each group of word lines WL by grouping a plurality of word lines WL. Such an example is shown in FIGS. 25 and 26. FIGS. 25 and 26 are conceptual diagrams of the history table. In the example of FIG. 25, two adjacent word lines WL are grouped. Indexes are respectively assigned to those four groups. Furthermore, in the example of FIG. 26, the word lines WL are divided into three groups: two (WL0 and WL1) in the lower layer of the NAND string 10, two (WL6 and WL7) in the upper layer thereof, and four (WL2 to WL5) provided therebetween. Then, indexes are assigned respectively to those three groups.

Described in the above embodiments as an example is the case where the same voltage (for example, VREAD) as that applied to the non-selected word lines WL in the normal read and shift read, is applied to the word lines WL in the refresh read. However, the voltage applied to the word lines WL in the refresh read may be larger than that applied in the normal read and shift read. Such a case will be described with reference to FIGS. 27 and 28. FIGS. 27 and 28 are timing charts of selected word line WLi, non-selected word line WL(i±1), the other non-selected word lines WL, dummy word lines WLDD and WLDS, and selection gate lines SGD and SGS in the normal read or shift read and in the refresh read; FIG. 27 shows the case where the refresh read is not performed on the non-selected string units, and FIG. 28 shows the case where the refresh read is also performed on the non-selected string units.

As shown in FIGS. 27 and 28, in the normal read or shift read, voltage VREADK is applied to non-selected word line WL(i±1), voltage VREAD is applied to the other non-selected word lines WL, and voltages VREAD_DD and VREAD_DS are applied to dummy word lines WLDD and WLDS. In contrast, in the refresh read, voltage (VREAD+ΔVREAD) is applied to all the word lines WL. ΔVREAD is a positive value, and is, for example, 1.0V. The threshold values of memory cell transistors can be thereby more effectively shifted to the high voltage side.

Note that the voltage applied to word lines WLi and WL(i±1) may be (VREADK+ΔVREADK) instead of (VREAD+ΔVREAD). ΔVREAD is a positive value, and (VREADK+ΔVREADK) may be the same value as or a different value from (VREAD+ΔVREAD). Similarly, the voltages applied to selection gate lines SGD and SGS may be (VREAD_DD+ΔVREAD_DD) and (VREAD_DS+ΔVREAD_DS). ΔVREAD_DD and ΔVREAD_DS are positive values, and (VREAD_DD+ΔVREAD_DD) and (VREAD_DS+ΔVREAD_DS) may be the same value as, or a different value from (VREAD+ΔVREAD).

Figure 29:
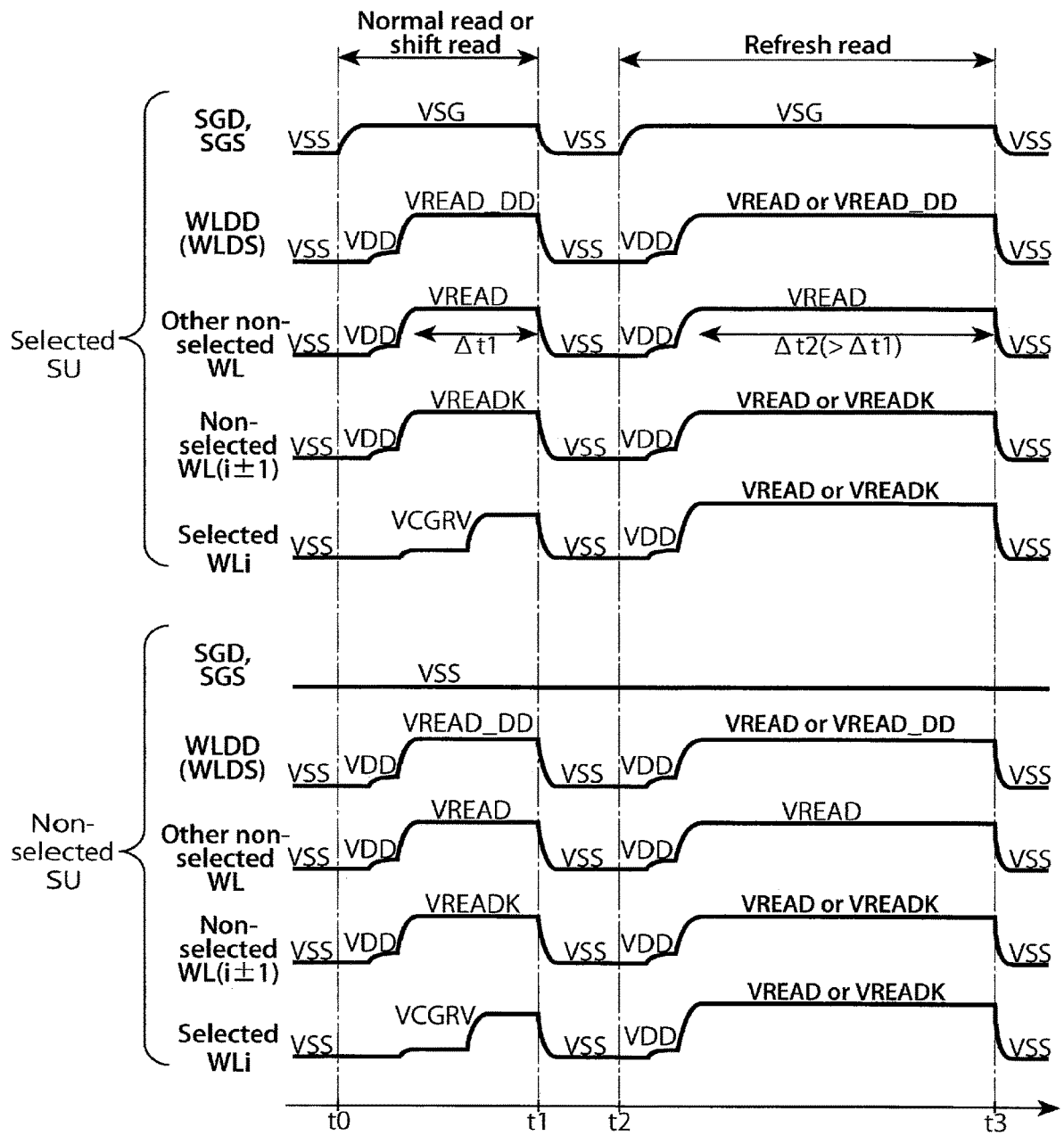

In addition, the voltage application period may be lengthened instead of increasing applied voltages as in the cases of FIGS. 27 and 28. Like FIGS. 27 and 28, FIGS. 29 and 30 are timing charts of voltages applied to each line; FIG. 29 shows the case where the refresh read is not performed on the non-selected string unit(s), and FIG. 30 shows the case where the refresh read is also performed on the non-selected string unit(s).

As shown in FIGS. 29 and 30, in the refresh read of the present modification, voltage VREADK is applied to word line WL(i±1), voltage VREAD is applied to the other word lines WL, and voltages VREAD_DD and VREAD_DS are applied to dummy word lines WLDD and WLDS, as in the normal read or shift read. However, the period during which those voltages VREAD, VREADK, VREAD_DD, and VREAD_DS are applied is longer in the refresh read (Δt2) than in the normal read or shift read (Δt1). For example, Δt2 is the double of Δt1 or longer. The present method also performs the same advantage as in the cases of FIGS. 27 and 28.

Needless to say, the method of FIGS. 27 and 28 may be combined with the method of FIGS. 29 and 30. Namely, the voltage applied to the word lines in the refresh read may be made higher than in the normal read and shift read while making Δt2 larger than Δt1. That is, threshold distributions can be more efficiently corrected by increasing the applied voltage as well as lengthening the application period. Instead of making the voltage applied to the word lines in the refresh read larger than in the normal read and shift read, Δt2 may be made smaller than Δt1. Namely, the time required for the refresh read may be shortened by increasing the applied voltage.

The magnitude of the voltage applied to the word lines in the refresh read and the length of the application period may be designated in the command sequence of the refresh read, or may be set by the set feature command. The following is an example of the command sequence:
 <XXh> <ZXh> <VALUE> <00h> <ADD> <ADD> <ADD> <ADD> <ADD> <30h>

After the prefix command "XXh" described above, command "ZXh" and data "VALUE" are transmitted from the controller 200 to the NAND flash memory 100. Command "ZXh" designates an increase of the voltage or lengthening of the voltage application period in the refresh read, and "VALUE" indicates a voltage value or an application period.

Described as an example, in the above embodiments is the case where the voltage shift amounts in the shift read are designated in the command sequence; however, the voltage shift amounts may be preset in the NAND flash memory 100 by the set feature command. Described as an example, in the above embodiments is the case where each memory cell transistor MT holds 3-bit data. However, the embodiments may be applied to the case where each memory cell transistor MT holds 2-bit data or 4 or larger bit data.

Note that in each embodiment concerning the present embodiments, (1) When the memory cell holds 2-bit data ("Er", "B", and "C"), the voltage applied to the selected word line in the reading operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the reading operation may be set within the range of, for example, 25 μs to 38 μs, 38 μs to 70 μs, or 70 μs to 80 μs.

(2) A writing operation may include a program operation and a verify operation. In the writing operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation may be ISPP (Incremental Step Pulse Program), the voltage of step-up may be, for example, 0.5 V.

The voltage applied to an unselected word line may be set within the range of, for example, 6.0 V to 7.3 V. However, the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the writing operation may be set within the range of, for example, 1,700 μs to 1,800 μs, 1,800 μs to 1,900 μs, or 1,900 μs to 2000 μs.

(3) In erasing operation,

The voltage first applied to the well which may be formed in the upper portion of the semiconductor substrate and above which the memory cell may be arranged may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 µs to 4,000 µs, 4,000 µs to 5,000 µs, or 4,000 µs to 9,000 µs.

(4) The structure of the memory cell

A charge accumulation layer may be arranged on a 4 to 10 nm thick tunnel insulating film. The charge accumulation layer may have a stacked structure of a 2 to 3 nm thick insulating film of SiN or SiON and 3 to 8 nm thick polysilicon. A metal such as Ru may be added to the polysilicon. An insulating film is provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a semiconductor memory including a memory cell array, the memory cell array including a first memory cell and a second memory cell configured to hold data and coupled respectively to a first word line and a second word line; and
   a controller configured to control the semiconductor memory,
   wherein the memory system is capable of executing a first operation and a second operation after the first operation,
   in the first operation, the controller issues a first command sequence and, in response to the first command sequence, the semiconductor memory applies a first voltage to the first word line and applies a second voltage to the second word line to read data from the first memory cell, and the read data is transmitted from the semiconductor memory to the controller,
   in the second operation, the controller issues a second command sequence and, in response to the second command sequence, the semiconductor memory applies a third voltage to the first word line and applies a fourth voltage to the second word line, and data held in the memory cell array is left untransmitted to the controller,
   the second operation is executed after the first operation without intervention of a write operation and erase operation on the first memory cell,
   the third voltage turns on the first memory cell regardless of data held in the first memory cell, and
   the second voltage and the fourth voltage turn on the second memory cell regardless of data held in the second memory cell.

2. The system according to claim 1, wherein the memory cell array includes a block which is a data erase unit,
   the block includes a plurality of memory cells coupled in series and including the first memory cell and the second memory cell,
   the memory cells are coupled to a plurality of word lines including the first word line and the second word line,
   in the second operation, one of the third voltage and the fourth voltage is applied to all the word lines.

3. The system according to claim 1, wherein the third voltage and the fourth voltage are equal to or larger than the second voltage.

4. The system according to claim 1, wherein a period in which the third voltage is applied to the first word line and a period in which the fourth voltage is applied to the second word line are equal to or longer than a period in which the second voltage is applied to the second word line.

5. The system according to claim 1, wherein the controller issues a third command sequence before the second command sequence to notify the semiconductor memory of values of the third voltage and the fourth voltage, or a period in which the third voltage is applied to the first word line and a period in which the fourth voltage is applied to the second word line.

6. The system according to claim 1, wherein the second command sequence is obtained by adding a first command to the first command sequence.

7. The system according to claim 1, wherein the first command sequence includes a first address designating a first region including the first memory cell in the memory cell array, and
   the second command sequence includes a second address designating the first region.

8. The system according to claim 1, wherein the controller holds information on a shift value of a voltage to be applied to the first word line when reading data from the first memory cell, and determines whether to execute the second operation in accordance with the shift value.

9. The system according to claim 8, wherein the information includes: a first table holding a relationship between a plurality of shift values concerning voltages to be applied to the first word line and application priority for applying the shift values; and a second table holding shift values to be applied, and
   the controller
   applies a voltage to the first word line in accordance with a first shift value held in the second table to read data from the first memory cell,
   when error correction on the read data is failed, applies a voltage to the first word line in accordance with a second shift value of second priority according to the application priority in the first table to read data from the first memory cell, and when error correction on the read data is successful, updates a shift value in the second table from the first shift value to the second shift value.

10. The system according to claim 9, wherein the controller executes the second operation when the second shift value is larger than a first reference value.

11. A memory system comprising:
a semiconductor memory including a first memory cell coupled to a first word line; and
a controller configured to control the semiconductor memory,
wherein the controller
instructs the semiconductor memory to apply a first read voltage to the first word line to read data from the first memory cell,
when the reading using the first read voltage is failed, instructs the semiconductor memory to apply a second read voltage different from the first read voltage to the first word line to read data from the first memory cell,
when the reading using the second read voltage is successful, instructs the semiconductor memory to apply a first voltage to the first word line, and
after application of the first voltage to the first word line, instructs the semiconductor memory to apply a third read voltage different from the second read voltage to the first word line to read data from the first memory cell.

12. The system according to claim 11, wherein the controller holds information on a read voltage to be applied to the first word line,
when the reading using the second read voltage is successful, updates the information to information corresponding to the second read voltage, and
when the first voltage is applied to the first word line, updates the information to information corresponding to the third read voltage.

13. The system according to claim 11, wherein the controller holds information on a voltage to be applied to the first word line,
when the reading using the second read voltage is successful, updates the information to information corresponding to the second read voltage, and
when the reading using the third read voltage is successful, updates the information to information corresponding to the third read voltage.

14. The system according to claim 11, wherein the first read voltage is smaller than the second read voltage, and the third read voltage is smaller than the second read voltage.

15. The system according to claim 11, wherein the first read voltage is larger than the second read voltage, and the third read voltage is larger than the second read voltage.

16. The system according to claim 11, wherein the semiconductor memory includes a block which is a data erase unit,
the block includes a plurality of memory cells coupled in series and including the first memory cell,
the memory cells are coupled respectively to a plurality of word lines including the first word line, and
the first voltage is applied to all the word lines.

17. The system according to claim 11, wherein the first voltage is equal to or larger than a voltage applied to a non-selected word line when reading data from the first memory cell.

18. The system according to claim 11, wherein a period in which the first voltage is applied to the first word line is equal to or longer than a period in which a voltage is applied to a non-selected word line when reading from the first memory cell.

19. The system according to claim 11, wherein the controller applies the first voltage to the first word line when the second read voltage is larger than a first reference value.

20. The system according to claim 11, wherein the application of the first voltage turns on the first memory cell.

* * * * *